United States Patent [19]
Acocella et al.

[11] Patent Number: 5,675,889
[45] Date of Patent: Oct. 14, 1997

[54] SOLDER BALL CONNECTIONS AND ASSEMBLY PROCESS

[75] Inventors: John Acocella, Hopewell Junction, N.Y.; Donald Ray Banks, Eau Claire, Wis.; Joseph Angelo Benenati, Hopewell Junction; Thomas Caulfield, Croton Fall, both of N.Y.; John Saunders Corbin, Jr., Austin; Karl Grant Hoebener, Georgetown, both of Tex.; David P. Watson, Beaverton, Oreg.

[73] Assignee: International Business Machines Corporation, Armonk, N.Y.

[21] Appl. No.: 474,343

[22] Filed: Jun. 7, 1995

Related U.S. Application Data

[62] Division of Ser. No. 144,981, Oct. 28, 1993.

[51] Int. Cl.$^6$ ............................................. H05K 3/36
[52] U.S. Cl. ................ 29/830; 29/840; 228/180.21; 228/180.22; 228/254; 437/183
[58] Field of Search .......................... 29/840; 437/183; 228/180.21, 180.22, 254

[56] References Cited

U.S. PATENT DOCUMENTS

| | | |
|---|---|---|
| 3,401,126 | 9/1968 | Miller et al. . |
| 3,403,438 | 10/1968 | Best et al. . |
| 3,429,040 | 2/1969 | Miller . |
| 3,518,756 | 7/1970 | Bennett et al. . |
| 3,554,877 | 1/1971 | Geisler . |
| 3,791,858 | 2/1974 | McPherson et al. . |
| 3,988,405 | 10/1976 | Smith et al. ............................ 264/63 |
| 4,132,341 | 1/1979 | Bratschun ............................ 228/122 |
| 4,202,007 | 5/1980 | Dougherty et al. . |
| 4,545,610 | 10/1985 | Lakritz et al. . |
| 4,604,644 | 8/1986 | Beckhan et al. . |
| 4,681,654 | 7/1987 | Clementi et al. ..................... 156/630 |
| 4,701,482 | 10/1987 | Itoh et al. ............................ 523/435 |
| 4,831,724 | 5/1989 | Elliott ................................. 29/840 |
| 4,878,611 | 11/1989 | LoVasco et al. . |
| 4,914,814 | 4/1990 | Behum et al. ........................ 29/843 |
| 4,999,699 | 3/1991 | Christie et al. . |
| 5,075,965 | 12/1991 | Carey et al. ......................... 29/840 |

(List continued on next page.)

FOREIGN PATENT DOCUMENTS

| | | | |
|---|---|---|---|
| 84464 | 7/1983 | European Pat. Off. ............... 437/183 |
| 0263222 | 10/1986 | European Pat. Off. ............... 21/48 |
| 0248566 | 5/1987 | European Pat. Off. ............... 21/58 |
| 2177641 | 7/1984 | United Kingdom ................. 1/12 |

OTHER PUBLICATIONS

IBM Tech. Disc. Bull. vol. 20 No. 8 Jan. 78' High Performance Package pp. 3090–3091.
IBM Tech. Disc. Bull. vol. 18 No. 5 Oct. 75' Semiconductor Device Carrier For Modules pp.1440–1441.
IBM Tech. Disc. Bull. vol. 33 No. 2 Jul. 90' Thermal Fatigue–Resistant Joint For I/C Packaging Applications pp. 253.
Sloan et al. :Oven Molded Padarray Carrier (OMPAC) "A New Kid on the Block" Motorola, Inc.; PO Box 6000; Austin, TX 78762 Feb. 93.
Costlay, T. "Ball Grid Arrays: The Hot New Package" in *Electronic Engineering Times* Mar. 15, '93 p.35,6.
Derman, G. "Solder Balls Make Connections" *In Electronic Engineering Times* Mar. 15, 93' p.37.

*Primary Examiner*—Carl J. Arbes
*Attorney, Agent, or Firm*—Michael E. Belk

[57] ABSTRACT

Two substrates are produced each with a planar, mirror-image matrix of metal contacts in a surface wiring layer. The substrates are positioned with the matrices in parallel confrontation which defines pairs of confronting contacts. A metal ball is positioned between each pair of contacts with a respective volume of joining material between the ball and each of the two respective contacts. The volumes of joining material are simultaneously melted to allow surface tension to align the substrates and to accurately center the balls between each respective pairs of contacts in a plane defines by the matrix of balls.

20 Claims, 8 Drawing Sheets

U.S. PATENT DOCUMENTS

| | | | |
|---|---|---|---|
| 5,120,678 | 6/1992 | Moore et al. | 437/183 |
| 5,130,779 | 7/1992 | Agarwala et al. | |
| 5,133,495 | 7/1992 | Angulas et al. | 228/180.1 |
| 5,147,084 | 9/1992 | Behun et al. | 228/56.3 |
| 5,154,341 | 10/1992 | Melton et al. | |
| 5,159,535 | 10/1992 | Desai et al. | |
| 5,201,451 | 4/1993 | Desai et al. | 228/5.5 |
| 5,203,075 | 4/1993 | Angulas et al. | 29/830 |
| 5,241,133 | 8/1993 | Mullen, III et al. | 174/52.4 |
| 5,261,155 | 11/1993 | Angulas et al. | 29/830 |

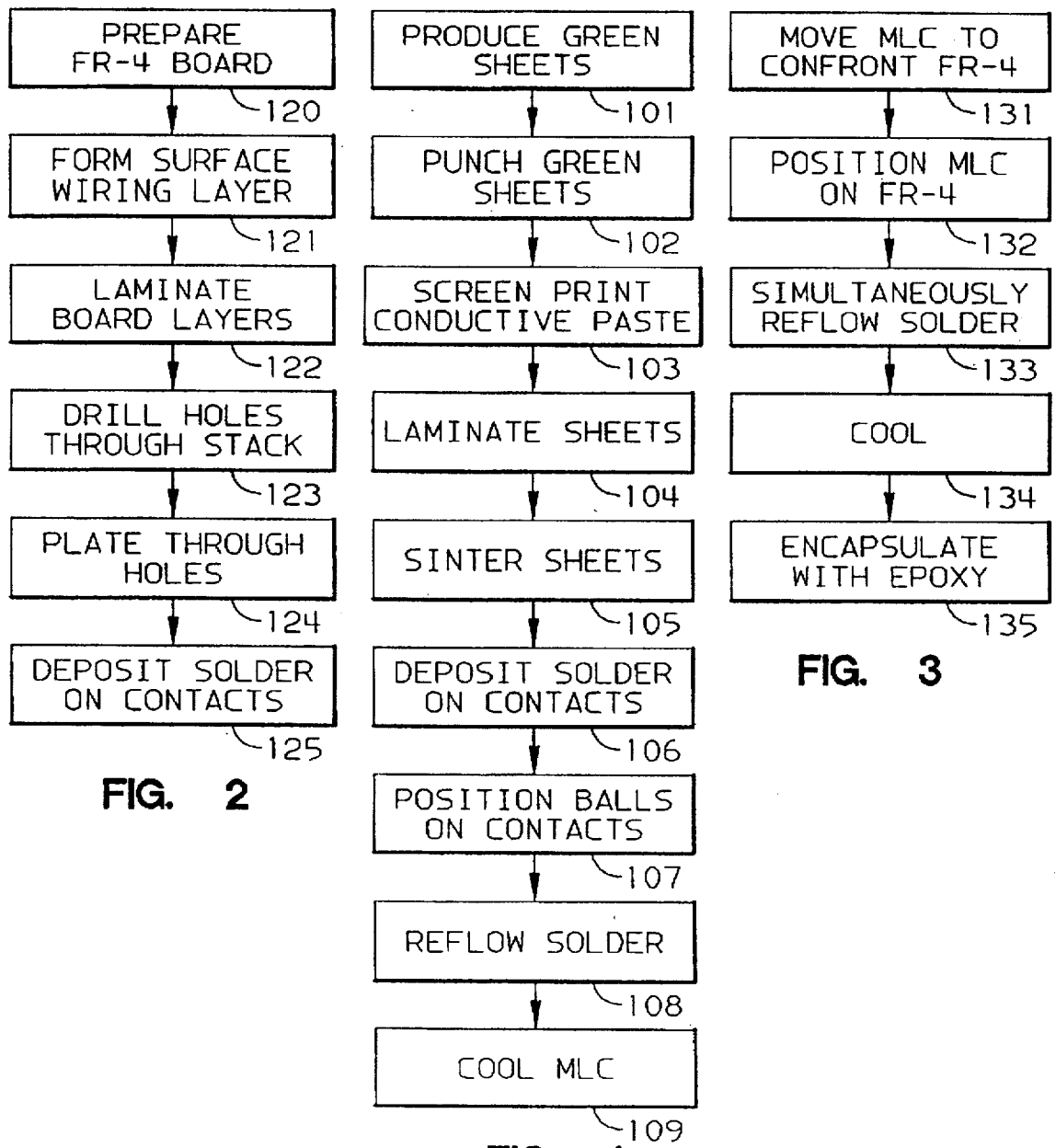

SOLDER BALL CONNECTIONS AND ASSEMBLY PROCESS

RELATED APPLICATIONS

This is a division of patent application Ser. No. 08/144,981, filed Oct. 28, 1993, entitled "Solder Ball Connections and Assembly Process" hereby incorporated in whole by reference.

FIELD OF THIS INVENTION

This invention relates to the field of information handling systems and specifically to second level packaging in which chip carrier modules are attached to circuit boards and more specifically to surface mount attachment of ceramic modules to organic circuit boards.

BACKGROUND OF THIS INVENTION

In the related field of first level packaging solder connections have been used for mounting Ics (integrated computer chips) using the C-4 (controlled collapse chip connection) technology since first described in U.S. Pat. Nos. 3,401,126 and 3,429,040 by Miller. *Packaging Electronic Systems* by Dally (McGraw-Hill 1990 p. 113) describes flip chip or C-4 connections. In Dally, "Chip bond pads are deployed in an area array over the surface of the chip . . . These bonding pads are 5 mil in diameter on 10 mil centers. Matching bonding pads are produced on a ceramic substrate so that the pads on the chip and the ceramic coincide. Spheres of solder 5 mil in diameter are placed on the ceramic substrate pads . . . and the chip is positioned and aligned relative to the substrate. The assembly is heated until the solder spheres begin to soften and a controlled collapse of the sphere takes place as the solder simultaneously wets both pads. A myriad of solder structures have been proposed for mounting IC chips as well as for interconnection to other levels of circuitry and electronic packaging." Ceramic is used as a substrate because it has a thermal coefficient of expansion (TCE) which is close to that of the silicon IC chips.

In the field of second level packaging "Ball Grid Arrays: The Hot New Package" by Terry Costlow and "Solder Balls Make Connections" by Glenda Derman both in *Electronic Engineering Times* Mar. 15, 1993, describe using solder balls to connect ceramic or flexible chip carriers to circuit boards.

U.S. Pat. No. 4,132,341 to Bratschum describes the self-centering action of conductors spanning between solder pads of two components when both pads are simultaneously reflowed. U.S. Pat. No. 4,831,724 describes the self-centering of a component when it is vibrated during reflow.

Fabrication of multi-layer ceramic chip carriers is described in U.S. Pat. Nos. 3,518,756; 3,988,405; and 4,202,007 as well as "A Fabrication Technique For Multi-Layer Ceramic Modules" by H. D. Kaiser et al., *Solid State Technology*, May 1972, pp. 35–40 and "The Third Dimension in Thick-Films Multilayer Technology" by W. L. Clough, *Microelectronics*, Vol. 13, No. 9 (1970), pp. 23–30.

Fabrication of multi-layer circuit boards is described in U.S. Pat. Nos. 3,554,877; 3,791,858; and 3,554,877. Thin film techniques are described in U.S. Pat. No. 3,791,858.

U.S. Pat. No. 4,604,644 to Beckham describes materials and structures for encapsulating C-4 connections. U.S. Pat. No. 4,701,482 to Itoh and U.S. Pat. No. 4,999,699 to Christie et al. disclose epoxies and guidance in selecting epoxies for electronic applications.

Flexible film chip carriers (known in the art as ATAB or TAB-BGA) are described in U.S. Pat. Nos. 4,681,654; 4,766,670 and 5,159,535. In ATAB (area tape automated bonding) a flexible circuit board chip carrier is mounted on a circuit board using solder-ball connect.

U.S. Pat. No. 5,147,084 to Behun, describes using a PIMP (high melting point) solder ball in association with a LMP (low melting point) solder. FIG. 1A of that patent is similar to FIG. 4 of this application. "A part 10 is to be joined to a board 11. Part 10 has internal metallurgy 14 which terminates at the surface at a bonding pads 12. A . . . LMP solder 16 is applied to a bonding pad 12. A . . . HMP solder ball 18 is placed in contact with LMP solder 16 and the assembly is heated to reflow the LMP solder which then wets to the non-molten HMP solder ball . . . Board 11 is also illustrated with internal metallurgy 15, terminating on the surface bonding pad 17 . . . the assembled part 10 . . . is brought into contact with part 11 having pad 17 and LMP solder 13, and the two are heated to a temperature sufficient to reflow the LMP solder but not sufficient to melt the HMP solder ball. The LMP solder 13 which is attached to the bonding pad 17, on board 11, will wet the HMP ball and connection will be achieved."

All the above sources are hereby incorporated by reference.

OBJECTS OF THIS INVENTION

In the invention of applicants, high melting temperature (HMT) preforms (balls or columns) connect between a grid array of contacts on the bottom of a component and a mirror image grid array of contacts on the top surface of an organic substrate to form an electrical interconnect structure. Low melting temperature (LMT) joining material connects between the HMT preforms and the contacts. The invention includes the compositions of the HMT preforms and LMT joining material, the specific geometry of the connections, organic circuit boards and ceramic chip carriers for such interconnections, the process for producing such boards and carriers, and the process for attaching the carriers to the boards. In this description "solder-ball connection" refers to using LMT joining materials to mechanically and electrically connect HMT preforms on a component to conductive contacts on a substrate.

Therefore, it is an object of this invention to provide a process for manufacturing a reliable interconnect assembly using HMT solder-ball connection.

More specifically, it is an object to connect two rigid, confronting substrates using HMT solder-ball connections to form an electronic packaging structure.

It is another object of this invention to provide a method of reflow soldering to produce solder-ball connections.

It is another object of this invention to provide methods for producing a component for solder-ball connection.

It is another object of this invention to provide methods of positioning solder-balls on such a component and reflow joining solder-balls to the component for use in solder-ball connection.

It is another object of this invention to provide a method of selecting HMT solder-ball size, selecting contact size, and selecting LMT solder volume.

It another object of this invention to provide a method of producing metal contacts on substrates for solder-ball connection.

Furthermore, it is an object of this invention to provide a reliable interconnect assembly in which HMT metal-balls are connected between mirror image arrays of contacts of two rigid, confronting substrates.

It is more specifically an object of this invention to define reliable LMT solder joint configurations between the balls and contacts.

It is another object of this invention to define ball sizes and contact sizes required for reliable connection.

It is another object of this invention to define HMT ball materials and LMT solder materials which permit reliable connections to be made.

It is another object of this invention to define substrates which may be used for reliable HMT solder-ball connection.

It is another object of this invention to define structures in a surface wiring layer of a substrate to connect between PTHs (plated through-holes) and connection pads for controlling LMT solder volumes for the joints between the pads and HMT solder-balls.

Finally, it is an object of this invention to describe an information handling system using the connections of the system.

SUMMARY OF THIS INVENTION

In this invention of applicants, it was discovered that solder-ball connections between confronting metal contact grids on rigid substrates which were made using a process similar to that which was used for ATAB were not reliable due to thermal fatigue of the solder joints between the balls and the contacts. It was discovered that the joints were not all symmetrical due to mis-registration of contacts (allowable tolerances in contact location) causing misalignment between confronting contacts, and that the joints could be made more symmetrical and more reliable by simultaneously reflowing the top and bottom LMT solder joints between each HMP metal-ball and both respective contacts of the ball. This allows the balls to be moved by surface tension of the melted solder to more symmetrical positions between the centers of the contacts within the plane defined by the array of the solder-balls.

It was discovered that making the balls larger reduces fatigue, but that the size of the balls is constrained by the specified interconnection spacing and a nominal spacing between balls necessary to reliably prevent electrical connection from developing between the balls. Similarly, it was discovered that making the contacts larger reduces fatigue, but the size of the contacts are constrained by the specified interconnect spacing and the nominal spacing between contacts necessary to reliably prevent electrical connection from developing between contacts (e.g. solder bridging). For reliable interconnections fatigue is minimized by making the balls slightly smaller than the spacing between contacts and making the contacts slightly smaller than the balls. It was discovered that the reliability of the connections were affected by the relative size between the contacts on either side of each ball and that fatigue could be minimized by making the contacts equal sized. It was discovered that fatigue could be minimized, for different sized contacts on each side of the ball, by making the solder volume larger for the joint with the smaller contact.

It was discovered that increasing the cross section of the solder joints reduced fatigue but the volume increase is constrained by the necessity to reliably prevent solder bridging from developing between adjacent balls and between adjacent contacts. Finally it was discovered that reducing the cross section of the solder joints below about ⅔ of the diameter of the ball has a remarkably deleterious effect on the fatigue life of the connection.

The invention of applicants includes the following processes and apparatus as well as others described later herein;

The invention of applicants includes a process for producing an interconnect-structure, comprising the steps of:

producing a rigid substrate with an approximately planer matrix of multiple, metal contacts on a major surface;

depositing a volume of a joining-material on each of the contacts of the matrix of the rigid substrate;

positioning a conductive metal-ball on the joining-material on each of the contacts on the first substrate to define a plane of metal-balls for maintaining a predetermined distance between the substrate and a second substrate to which the substrate is to be connected;

melting the volumes of joining-material without melting the metal-balls to prevent changing the shape of the balls; and cooling the joining-material to form a solid mechanical joint between the metal-balls and the contacts of the first substrate.

The process for producing an interconnect structure, in which there is a metal element which can migrate between the metal-balls and the joining-material and increase the melting temperature of the joining-material and the step of melting is performed at a minimum temperature and for a minimum time required to produce reliable joints for minimizing migration of metal elements between the metal-balls and first joining-material to minimize the increase of the melting temperature of the joining-material.

The process for producing an interconnect structure, further including the steps of:

selecting the size of the metal-balls slightly smaller than the spacing between the balls to maximize the size of the balls to minimize fatigue in the joints; and selecting the size of the contacts:

slightly smaller than the size of the metal-balls as required to prevent joining-material from bridging between contacts; and for confronting contacts, to be approximately equal in size to minimize fatigue in the joints.

The process for producing an interconnect structure, further including the steps of:

selecting ceramic for the material of the rigid substrate;

selecting copper for the material of the contacts; and selecting a LMT (low melting temperature) solder alloy as the joining-material and a HMT (high melting temperature) solder for the metal-balls.

The process for producing an interconnect structure, further including the step of selecting re-enforced epoxy for the material of the rigid substrate.

The process for producing an interconnect structure, in which the step of producing a rigid substrate includes the steps of:

producing multiple green sheets of glass/ceramic particles and an organic binder;

making via holes in the sheets;

screen printing conductive material into the holes and onto one of the surfaces of the sheets to form a conductive pattern including the array of round contacts;

pressing the sheets together into a stack;

sintering the stack of sheets in an oven to form a multilayer ceramic chip carrier with an array of copper contacts on a major surface which are about 0.7 mm in diameter, and are spaced about 1.25 mm apart;

selecting eutectic (about 37/63 percent) Pb/Sn solder alloy for the joining-material; and selecting a material of about 90% to about 95% Pb solder alloy and a size of about 0.9 mm for the metal-balls.

The process for producing an interconnect structure, further including the step of depositing sticky flux onto the contacts before positioning the metal-balls onto the contacts for holding the balls in place.

The process of producing an interconnect structure, further including the step of selecting elongated balls for interconnecting, and reflowing while holding the horizontal axis of the balls approximately perpendicular to the major surface of the substrate.

The process of producing an interconnect structure, further including the step of selecting elongated balls for interconnecting, and reflowing with the substrate horizontal inverted during reflow for gravity to hold the longitudinal axis of the balls vertically aligned.

The invention further-includes, a process for fabricating an interconnect structure, comprising the steps of:

producing a fiberglass re-enforced epoxy board;

drilling one or more holes through the board;

plating the interior of the through-holes with conductive metal;

forming lands of conductive metal around the holes on a major surface of the board;

forming a rectangular array or grid of multiple, circular, conductive, metal contacts which are larger than the lands and positioned so that four contacts define a square that surrounds each of the lands; and forming a conductor extending in a diagonal direction in relation to the square to one of the contacts between each respective land and one of the surrounding contacts.

The process for fabricating an interconnect structure, in which the steps of plating the holes, forming lands, forming contacts and forming a conductor are performed simultaneously in an additive photo-lithographic process.

The process for fabricating an interconnect structure, further comprising the step of depositing joining-material on the contacts.

The immediately preceding process for fabricating an interconnect structure with deposited joining-material, further comprising the step of connecting to the joining-material, a metal-ball with a melting temperature substantially above the melting temperature of the joining-material.

The immediately preceding process for fabricating an interconnect structure, further comprising the step of heating to melt the joining-material to reflow connect the balls onto the contacts and then cooling the joining-material to solidify it.

The invention also includes a process for making an interconnect assembly, comprising the steps of:

producing an FR-4 board with a multitude of wiring layers;

forming circular copper lands in a wiring layer on a major surface of the board;

making holes through the lands and through the board;

selectively depositing copper after drilling to plate the through-holes for connecting the lands to other wiring layers;

forming a rectangular array or grid of round copper contacts larger than the lands, about 0.7 mm diameter, and spaced at about 1.25 mm centers on the major surface and arranged so that four contacts define a square that surrounds each of the lands;

forming a conductor which is narrower than the contacts and narrower than the lands which extend between each of the lands surrounded by contacts in a diagonal direction in relation to the square of surrounding contacts;

depositing solder resist at least partially covering the conductor and the lands and extending between the contacts to prevent solder bridging;

depositing a joining solder material containing about 37/63% Pb/Sn solder alloy on each of the contacts in the array on the board;

producing multiple green sheets of glass/ceramic particles and an organic binder;

forming via holes through the sheets;

screen printing conductive material into the holes and onto one of the surfaces of the sheets to form a conductive pattern;

stacking the sheets together;

sintering the stack of sheets in an oven to form a multilayer ceramic chip carrier with an array of copper contacts on a major surface which are about 0.7 mm wide, are spaced about 1.25 mm apart, and are arranged approximately mirror image to the array of contacts of the board;

forming an array of round contacts on an exterior major surface of the carrier;

depositing solder resist between the contacts to prevent solder bridging;

depositing a joining solder material containing about 37/63% Pb/Sn solder alloy on each of the contacts in the array on the carrier;

positioning a ball of about 90/10% Pb/Sn solder alloy and about 0.9 mm diameter in contact with the joining solder on each respective contact in the array of the carrier to define a plane of solder-balls;

reflowing to melt the joining solder material deposited on the contacts of the carrier without melting the solder-balls in order to solder the balls to the contacts of the carrier and using the minimal temperature and time required to form reliable mechanical joints in order to minimize diffusion of Pb from the balls into the melted solder;

cooling the carrier to solidify the joining solder;

positioning the ceramic carrier parallel to the circuit board with the solder-balls about in contact with the joining solder deposited on the array of contacts on the board so that each solder-ball is between a pair of contacts;

heating the substrates while positioned together to a temperature at which the solder deposited on the contacts of both the carrier and board are simultaneously melted and the solder-balls remain solid for moving the solder-balls by surface tension of the melted solder material in directions within the plane of the solder-balls to positions about midway between the centers of the pairs of contacts to produce symmetric connections between the substrates; and cooling the substrates below the melting temperature of the solder materials to solidify the solder material.

The process for making an interconnect assembly, in which:

each of the contacts on the board include a very thin extension over the solder resist;

the solder is deposited on the contacts of the board, including the extensions, by wave soldering; and the holes are formed in the board by drilling and formed in the sheets by punching;

and the process further comprises the steps of:

reflowing the deposited joining solder on the carrier before positioning the solder-balls;

flattening the joining solder on the carrier before positioning the solder-balls on the carrier;

depositing sticky flux on the flattened joining solder on the carrier before positioning the solder-balls on the carrier;

reflowing the deposited solder on the board before positioning the carrier with the board;

flattening the joining solder on the board before positioning the carrier with the board; and applying flux to the flattened joining solder for joining the balls to the board before positioning the carrier with the board.

The invention also includes an interconnect assembly comprising:

a first and second interconnect substrates;

a planer pattern of multiple, metal contacts on a major surface of each respective substrate, for interconnection between the substrates, which are mirror images of each other to provide confronting pairs of contacts;

a ball of conductive metal for respective pairs of such contacts with a diameter about the same as the width of the contacts; and a volume of a first joining-material for each such pair of contacts connected to the respective contact of the first interconnect substrate and a volume of a second joining-material for each such pair of contacts connected to the respective contact of the second interconnect substrate, with melting temperatures of the joining-materials of both the first and second volumes substantially less than the melting temperature of the metal-balls, with the first and second volumes of each pair of contacts connected to approximately diametrically opposite ends of a respective metal-ball, and with the smallest cross sectional area of each joining-material volume having a minimum diameter at least about ⅔ of the diameter of the metal-ball.

The interconnect assembly, in which the balls are elongate with their longitudinal axis about perpendicular to the major surface of each substrate.

The interconnect assembly, in which the diameter of the metal-balls and width of the contacts are about 0.6 mm to about 1.2 mm and the minimum diameter of such cross section of each joining-material volume is at least about 0.6 mm.

The immediately preceding interconnect assembly, in which the contacts are round with a diameter of about 0.7 mm and the diameter of the metal-balls is about 0.9 mm.

The interconnect assembly, in which the alloy of the metal-ball includes about 80% to about 97% Pb with most of the balance being Sn.

The immediately preceding interconnect assembly, in which the alloy of the metal-ball is from about 90% to about 95% Pb.

The interconnect assembly, in which the alloy of the joining-materials include approximately eutectic solder alloy.

The interconnect assembly, in which at least one of the substrates is multi-layer, and the structure further comprises one or more vias connecting between a surface wiring layer of the multi-layer substrate and another wiring layer of the multi-layer substrate which are integral with the contacts of a multi-layer substrate.

The interconnect assembly, in which the first and second joining-materials have about the same melting temperatures.

The interconnect assembly, in which a multitude of the contacts are connected with plated through-holes and in which the structure further comprises means to control the solder volume.

The interconnect assembly, in which:

the positions of the contacts are defined by intersections of a multitude of parallel equally spaced lines in each of two perpendicular directions in a plane of the surface at the contacts; and the first interconnect substrate further includes:

multiple wiring layers including one on a major surface of the substrate in which the contacts are positioned;

a multitude of conducting vias connecting between one or more other wiring layers of the substrate and the surface wiring layer at about the centers of squares defined by four of the contacts; and a conductor of the surface wiring layer for each respective via, which is substantially narrower than the contacts, and extends in a diagonal direction of the square to connect between the via and one of the four contacts surrounding the via.

The immediately preceding interconnect assembly, in which:

the surface wiring layer containing the contacts further includes lands surrounding the vias;

the conductors extend from the lands to the contacts; and the via through-holes are internally plated with a layer of copper sufficiently thick to electrically connect between the lands and other wiring layers of the structure.

The invention also includes a fabricated interconnect assembly comprising:

a first and second interconnect substrates;

a planer pattern of multiple, metal contacts on each respective substrate, for interconnection between the substrates, which are mirror images of each other to provide confronting pairs of contacts;

a ball of conductive metal for respective pairs of such contacts with a diameter about the same as the width of the contacts; and a volume of a first joining-material for each such pair of contacts connected to the respective contact of the first interconnect substrate and a volume of a second joining-material for each such pair of contacts connected to the respective contact of the second interconnect substrate, with melting temperatures of the first and second joining-materials both substantially less than the melting temperature of the metal-balls, with the volumes of the first and second joining-materials of each pair of contacts connected to approximately diametrically opposite ends of a respective metal-ball, and with the melting temperatures of the first and second joining-materials being about equal.

The fabricated interconnect structure, in which:

the alloy of the metal-ball is from about 85% to about 97% Pb and most of the balance being Sn; and the joining-material includes about 37/63 percent Pb/Sn solder alloy.

The immediately preceding fabricated interconnect structure, in which the joining-material is about 65% to about 75% Pb.

The invention also includes an interconnect structure comprising:

a substrate;

a planer pattern of multiple, metal contacts for interconnecting the substrate, to another substrate with mirror image contacts;

a ball of conductive metal for each contact with a diameter about the same as the width of the contacts;

a volume of a joining-material connected between each respective contact and the respective metal-ball for that contact, with a melting temperature of the joining-material substantially less than the melting temperature of the metal-ball, and with the smallest cross-sectional area of the joining-material volumes having a minimum diameter at least about ⅔ of the diameter of the metal-ball.

The interconnect structure, in which the diameter of the metal-ball and width of the contacts are about 0.6 mm to about 1.2 mm and the minimum diameter of such cross section of each joining-material volume is at least about 0.6 mm.

The immediately preceding interconnect structure, in which the diameters of the contacts are from about 15% to about 30% smaller than the diameters of the balls.

The immediately preceding interconnect structure, in which the diameter of the metal-ball is about 0.9 mm and width of the contacts are about 0.7 mm.

The interconnect structure, in which the alloy of the metal-balls include about 80% to about 97% Pb with substantially all the balance being Sn.

The immediately preceding interconnect structure, in which the alloy of the metal-ball is from about 90% to about 95% Pb.

The interconnect structure, in which the joining-materials include approximately eutectic solder alloy.

The interconnect structure, in which the joining-materials are about 25% to about 50% Pb and most of the balance being Sn.

The interconnect structure, in which:

the positions of the contacts are defined by intersections of a multitude of parallel equally spaced lines in each of two perpendicular directions in a plane of the surface at the contacts; and the substrate is a multi-layer ceramic substrate; and the structure further comprises one or more vias connecting between a surface wiring layer of the multi-layer substrate and another wiring layer of the multi-layer substrate which are integral with the contacts of a multi-layer substrate and filled with a conductive material with a melting point significantly higher than the melting point of the joining-material.

The interconnect structure, in which:

the positions of the contacts are defined by intersections of a multitude of parallel equally spaced lines in each of two perpendicular directions in a plane of the surface at the contacts; and the substrate is an FR-4 circuit board and the structure further includes:

multiple wiring layers including one at the surface of the substrate in which the contacts are positioned;

a multitude of conducting vias connecting between one or more other wiring layers of the substrate and the surface wiring layer at about the centers of squares defined by four of the contacts; and a conductor of the surface wiring layer for each respective via, which is substantially narrower than the contacts, and extends in a diagonal direction of the square to connect between the via and one of the four contacts surrounding the via.

The invention also includes, a fabricated interconnect structure comprising:

a multi-layer substrate having a wiring layer on the surface of the substrate;

a multitude of metal contacts in a matrix at positions defined by intersections of a grid of a multitude of parallel equally spaced lines in each of two respective about perpendicular directions in a plane of the surface wiring layer;

a multitude of conducting vias connecting between one or more other wiring layers of the substrate and the surface wiring layer at about the centers of squares defined by four of the contacts; and a conductor of the surface wiring layer for each respective via, which is narrower than the contacts, and extends in a diagonal direction of the square to connect between the via and one of the four contacts surrounding the via.

The fabricated interconnect structure, further comprising, a layer of solder resist covering most of each surface conductor, and with openings for the contacts.

The fabricated interconnect structure, further comprising round lands surrounding and connected to the vias; and in which the contacts are round, the lands are smaller in diameter than the contacts, and the diagonal connectors are narrower than the diameters of both the contacts and the lands.

The fabricated interconnect structure, in which the contacts are about 0.6 mm to about 1.2 mm in diameter, the width of the diagonal conductors are less than about half the diameters of the contacts.

The fabricated interconnect structure, in which the vias are partially open.

The fabricated interconnect structure, in which the vias are filled with a LMT solder.

The fabricated interconnect structure, in which the vias are plated through-holes.

The invention includes an information handling system comprising:

one or more processing units connected in a network;

random access memory communicating through a bus with each central processor unit;

input/output means for communication between processor units and with computer peripherals;

a circuit board in communication with one or more of the central processing units, with a planer pattern of round, metal contacts having a diameter of about 0.6 mm to about 1.0 mm on a major surface;

a chip carrier for one or more chips with a planer pattern of multiple, metal contacts on a major surface which is approximately a mirror image of a planer pattern of contacts on the circuit board to provide confronting pairs of contacts for interconnection between the carrier and the board and which are also about 0.5 mm to about 1.0 mm in width;

a metal-ball for each respective pair of such contacts with a diameter of about 0.6 mm to about 1.3 mm; and a volume of a first joining-material for each pair of contacts connected to a respective contact of the chip carrier and a volume of a second joining-material for each pair of contacts connected to a respective contact of the circuit board, with melting temperatures of both the first and second joining-material substantially less than the melting temperature of the metal-balls, with the first and second joining-materials of each pair of contacts soldered to diametrically opposite ends of the respective metal-ball.

The information handling system, in which each joining-material volume has a cross section of at least ⅔ the diameter of the metal-ball.

The information handling system, in which each joining-material volume has a cross section of at least about 0.6 mm.

The information handling system, in which the melting temperatures of the first and second joining-materials are about equal.

The information handling system, in which the confronting pairs of contacts have about equal diameters.

The information handling system, in which the volumes of joining-material for the respective contacts are about inversely proportional to the diameters of the contacts.

The information handling system, in which the diameter of the contacts are about 15% to about 30% smaller than the diameter of the metal-balls.

The information handling system, further comprising:
a layer of solder resist between the contacts of each of the patterns of contacts.

The information handling system, in which the circuit board is multi-layered and the contacts are associated with plated through holes and further comprising means to control the volume of the second joining-material.

The information handling system, in which:
the circuit board is multi-layered;
the positions of the contacts are defined by intersections of a multitude of approximately parallel, about equally spaced lines in each of two about perpendicular directions in a plane of the surfaces at the contacts; and
the circuit board further includes:
a multitude of wiring layers including one on the surface in which the contacts of the circuit board are positioned;
a multitude of plated through-holes connecting between one or more other wiring layers of the circuit board and the surface wiring layer for soldering to the metal-balls;
means to control the minimum diameter of the solder volume of soldered connections for the vias including:
a circular via land contact in the surface wiring layer for each respective via connected to the end of each via at the surface;
positioning the connections of the vias with the surface wiring layer at about the centers of squares defined by four of the contacts;
a metal conductor of the surface wiring layer for each respective via, which is substantially narrower than the contacts, and extends in a diagonal direction of the square to connect between the via land and one of the four contacts surrounding the via land;
a covering of solder resist over the lands and conductors and which provides windows for the contacts.

The invention also includes interconnect apparatus comprising:
a first and second interconnect substrates;
a planer pattern of multiple, metal contacts on each respective substrate, for interconnection between the substrates, which are mirror images of each other to provide confronting pairs of contacts;
a column of conductive metal for respective pairs of such contacts with a diameter about the same as the width of the contacts and positioned with a longitudinal axis perpendicular to the plane of contacts;

a volume of a first joining-material for each such pair of contacts connected to the respective contact of the first interconnect substrate and a volume of a second joining-material for each such pair of contacts connected to the respective contact of the second interconnect substrate, with melting temperatures of the joining-materials of both the first and second volumes substantially less than the melting temperature of the metal-columns, with the first and second volumes of each pair of contacts connected to opposite ends of a respective metal-column.

The interconnect apparatus, in which the width of the contacts is about 0.5 to about 1.2 mm and the diameter of the metal-columns is less than or about equal to the width of the contacts.

The immediately preceding interconnect apparatus, in which the contacts are round with a diameter of about 0.7 mm to 0.9 mm and the diameter of the metal-columns is about 0.1 mm to 0.3 mm less than the diameter of the contacts.

The interconnect apparatus, in which the alloy of the metal-column includes about 80% to about 97% Pb with most of the balance being Sn.

The immediately preceding interconnect apparatus, in which the alloy of the metal-column is from about 90% to about 95% Pb.

The interconnect apparatus, in which the alloy of the joining-materials include approximately eutectic solder alloy.

The interconnect apparatus, in which an end of the column is rounded.

The interconnect apparatus, in which an end of the column is an approximately flat plane approximately perpendicular to a longitudinal axis of the column.

The interconnect apparatus, in which the first and second joining-materials have about the same melting temperatures.

The interconnect apparatus, in which a multitude of the contacts are connected with plated through-holes and in which the structure further comprises means to control the solder volume.

The interconnect apparatus, in which:
the positions of the contacts are defined by intersections of a multitude of about parallel about equally spaced lines in each of two about perpendicular directions in a plane of the surface at the contacts; and
the first interconnect substrate further includes:
multiple wiring layers including one on a major surface of the substrate in which the contacts are positioned;
a multitude of conducting vias connecting between one or more other wiring layers of the substrate and the surface wiring layer at about the centers of squares defined by four of the contacts; and
a conductor of the surface wiring layer for each respective via, which is substantially narrower than the contacts, and extends in a diagonal direction of the square to connect between the via and one of the four contacts surrounding the via.

The immediately preceding interconnect apparatus, in which:
the surface wiring layer containing the contacts further includes lands surrounding the vias;
the conductors extend from the lands to the conductors; and
the via through-holes are internally plated with a layer of copper sufficiently thick to electrically connect between the lands and other wiring layers of the structure.

The invention also includes fabricated interconnect apparatus comprising:

a substrate;

a planer pattern of multiple, metal contacts for interconnecting the substrate to another substrate with mirror image contacts;

a column of conductive metal for each contact with a diameter about the same as the width of the contacts and positioned about perpendicular to the plane of contacts; and a volume of a joining-material connected between each respective contact an the respective metal-column for that contact, with a melting temperatures of the joining-material substantially less than the melting temperature of the metal-column.

The fabricated interconnect apparatus, in which the width of the contacts is about 0.5 mm to about 1.2 mm and the metal-columns are from about 0.4 mm less to about 0.1 mm more than the width of the contacts.

The immediately preceding fabricated interconnect apparatus, in which the width of the contacts is about 0.7 mm to about 0.9 mm and width of the metal-column is about the same to about 0.2 mm less than the width of the contacts.

The fabricated interconnect apparatus, in which the alloy of the metal-column includes about 80% to about 97% Pb with substantially all the balance being Sn.

The immediately preceding fabricated interconnect apparatus, in which the alloy of the metal-column is from about 90% to about 95% Pb.

The fabricated interconnect apparatus, in which the joining-materials include approximately eutectic solder alloy.

The fabricated interconnect apparatus, in which the joining-materials are about 25% to 50% Pb with most of the balance being Sn.

The fabricated interconnect apparatus, in which:

the positions of the contacts are defined by intersections of a multitude of about parallel, about equally spaced lines in each of two about perpendicular directions in a plane of the surface at the contacts;

the substrate is a multi-layer ceramic substrate, and the apparatus further comprises one or more vias connecting between a surface wiring layer of the multi-layer substrate and another wiring layer of the multi-layer substrate which are integral with the contacts of a multi-layer substrate and filled with a conductive material with a melting point temperature significantly higher than the melting point temperature of the joining-material.

The fabricated interconnect apparatus, in which:

the positions of the contacts are defined by intersections of a multitude of about parallel about equally spaced lines in each of two about perpendicular directions in a plane of the surface at the contacts; and the substrate is an FR-4 circuit board and the structure further includes:

multiple wiring layers including one on the surface of the substrate in which the contacts are positioned;

a multitude of conducting vias connecting between one or more other wiring layers of the substrate and the surface wiring layer at about the centers of squares defined by four of the contacts; and a conductor of the surface wiring layer for each respective via, which is substantially narrower than the contacts, and extends in a diagonal direction of the square to connect between the via and one of the four contacts surrounding the via.

The invention also includes a process for producing interconnect assemblies comprising the steps of:

producing a first substrate with an approximately planer pattern of multiple, metal contacts on a major surface;

depositing a volume of a first joining-material on each of the contacts of the first substrate;

connecting a conductive metal-column to the first joining-material on each of the contacts on the first substrate for maintaining a predetermined distance between the first substrate and a second substrate when connected;

producing a second substrate with a major surface having an approximately planer pattern of multiple, metal contacts which are approximately a mirror image of the pattern of contacts of the first substrate;

depositing a volume of a second joining-material for positioning between the metal-columns and each respective contact of the second substrate;

positioning the substrates together for interconnection with contact patterns parallel, with mirror image pairs of contacts in confronting approximate alignment, and with each volume of the second joining-material approximately in contact with a respective end of the metal-column and a respective contact of the second substrate;

simultaneously melting the first and second joining-materials while the substrates are positioned together, at a temperature in which the metal-columns remain solid for providing about the predetermined separation between substrates, for moving the ends of the metal-columns by surface tension of the melted joining-material to positions approximately at the centers of the contacts; and cooling the substrates below the melting temperatures of the joining-materials to form electrical interconnections between the pairs of contacts.

The process for producing interconnect assemblies, in which the volumes of the second joining-material are deposited on the contacts of the second substrate prior to positioning the substrates together for interconnection.

The process for producing interconnect assemblies, in which the volumes of second joining-material are deposited at projecting ends of the metal-columns after the columns are connected to the first substrate prior to positioning the substrates together for interconnection.

The process for producing interconnect assemblies, in which the step of connecting a metal-column to the first volumes of joining-material includes the steps of:

positioning a metal-column on each volume of first joining-material;

heating up the first substrate to connect the metal-columns to the contacts of the first substrate by melting the first joining-material without melting the metal-columns; and cooling the first substrate down to form a mechanical joint between the metal-columns and the contacts of the first substrate before the step of positioning the substrates together for interconnection.

The immediately preceding process for producing interconnect assemblies, in which there is a metal element which can migrate between the metal-columns and the first joining-material and increase the melting temperature of the first joining-material and during the step of heating up the first substrate, the substrate Is heated to a minimum temperature and for a minimum time for minimizing migration of a metal elements between the metal-columns and first joining-material to minimize the increase of the melting temperature of the first joining-material.

The immediately preceding process for producing interconnect assemblies, further comprising the step of, selecting a different joining-material for the first and second joining-materials for compensating for migration of the metal element between the metal-columns and first joining-material in order for the first and second joining-materials to simultaneously melt during the step of heating up the substrates while positioned together.

The process for producing interconnect assemblies, in which there is a metal element which can migrate between the metal-columns and the joining-materials and which increases the melting temperature of the joining-materials, and in which the substrates are heated together at a sufficiently high temperature for a sufficiently long time to allow migration of the metal element between the metal-columns and joining-materials to substantially raise the melting temperature of the joining-materials so that the interconnections connections are not remelted during subsequent joining of attachments to the substrates using substantially the same joining-material as the volumes of joining-material.

The process for producing interconnect assemblies, further including the steps of:
  selecting the size of the contacts as large as possible while reliably preventing joining-material bridging between contacts; and
  selecting the size of the metal-columns the same size or slightly smaller than the spacing between the contacts to maximize the size of the columns while reliably preventing solder-bridging and to minimize fatigue in the columns.

The process for producing interconnect assemblies, further including the steps of:
  depositing a liquid encapsulating material between the substrates around the metal-columns in the area defined by the contact pattern after the step of cooling the substrates below joining-material melting temperatures; and
  hardening the encapsulating material to reduce the stresses in the joints during subsequent thermal cycling of the connected substrates.

The process for producing interconnect assemblies, further comprising the steps of:
  selecting a shape for the contacts to maximize the size of the contacts which may be reliably connected without bridging for making the size of the contacts larger to reduce thermal fatigue; and
  depositing solder resist between the contacts for making the size of the contacts which may be reliably connected without bridging larger to reduce thermal fatigue.

Finally the invention includes a process for producing interconnect structures, comprising the steps of:
  making a rigid substrate with an approximately planer matrix of multiple, metal contacts on a major surface;
  depositing a volume of a joining-material on each of the contacts of the matrix of the rigid substrate;
  positioning a conductive metal-column to the joining-material on each of the contacts on the first substrate for maintaining a predetermined distance between the substrate and a second substrate to which the substrate is to be connected;
  melting the volumes of joining-material without melting the metal-columns to prevent changing the shape of the columns; and
  cooling the joining-material to form a solid mechanical joint between the metal-columns and the contacts of the substrate.

The process for producing an interconnect structures, in which there is a metal element which can migrate between the metal-columns and the joining-material and increase the melting temperature of the joining-material and during the step of melting is performed at a minimum temperature and for a minimum time required to produce reliable joints for minimizing migration of a metal elements between the metal-columns and first joining-material to minimize the increase of the melting temperature of the joining-material.

The process for producing interconnect structures, further including the steps of:
  selecting the size of the contacts as large as possible limited only by reliably preventing joining-material bridging between contacts; and
  selecting the size of the metal-columns about the same size or slightly smaller than the contacts to maximize the size of the columns to minimize fatigue in the joints without causing solder bridging.

The process for producing interconnect structures, further including the steps of:
  selecting ceramic for the material of the rigid substrate;
  selecting copper for the material of the contacts; and
  selecting a LMT (low melting temperature) solder alloy as the joining-material and a HMT (high melting temperature) solder for the metal-columns.

The process for producing interconnect structures, further including the step of selecting FR-4 for the material of the rigid substrate.

The process for producing interconnect structures, in which the step of making a rigid substrate includes the steps of:
  producing multiple green sheets of glass/ceramic particles and an organic binder;
  making via holes in the sheets;
  screen printing conductive material into the holes and onto one of the surfaces of the sheets to form a conductive pattern including the array of round contacts;
  pressing the sheets together into a stack;
  sintering the stack of sheets in an oven to form a multilayer ceramic chip carrier with an array of copper contacts on a major surface which are about 0.7 mm in diameter and spaced about 1.25 mm apart;
  selecting eutectic (about 37/63%) Pb/Sn solder alloy for the joining-material;
  selecting a material of about 90% to about 95% Pb solder alloy and a size of about 0.9 mm for the metal-columns.

The process for producing interconnect structures, further including the step of depositing sticky flux onto the contacts before positioning the metal-columns onto the contacts for holding the columns in place.

The process for producing interconnect structures, further including the step of holding the metal-columns vertical during reflow to join the columns to the module.

The process for producing interconnect structures, further including the step of inverting the module during reflow to join the columns to the module.

This invention will be described in greater detail in reference to the following drawings.

BRIEF DESCRIPTION OF THE DRAWINGS

FIG. 1 is a process diagram which illustrates producing a multi-layer ceramic chip carrier (MLC) of this invention.

FIG. 2 illustrates the process for producing a fiberglass-epoxy circuit board (e.g. FR-4) of this invention.

FIG. 3 illustrates the process for producing the connections between the MLC and FR-4 in this invention.

DESCRIPTION OF EMBODIMENTS INCLUDING THE BEST MODE

Figure 4:
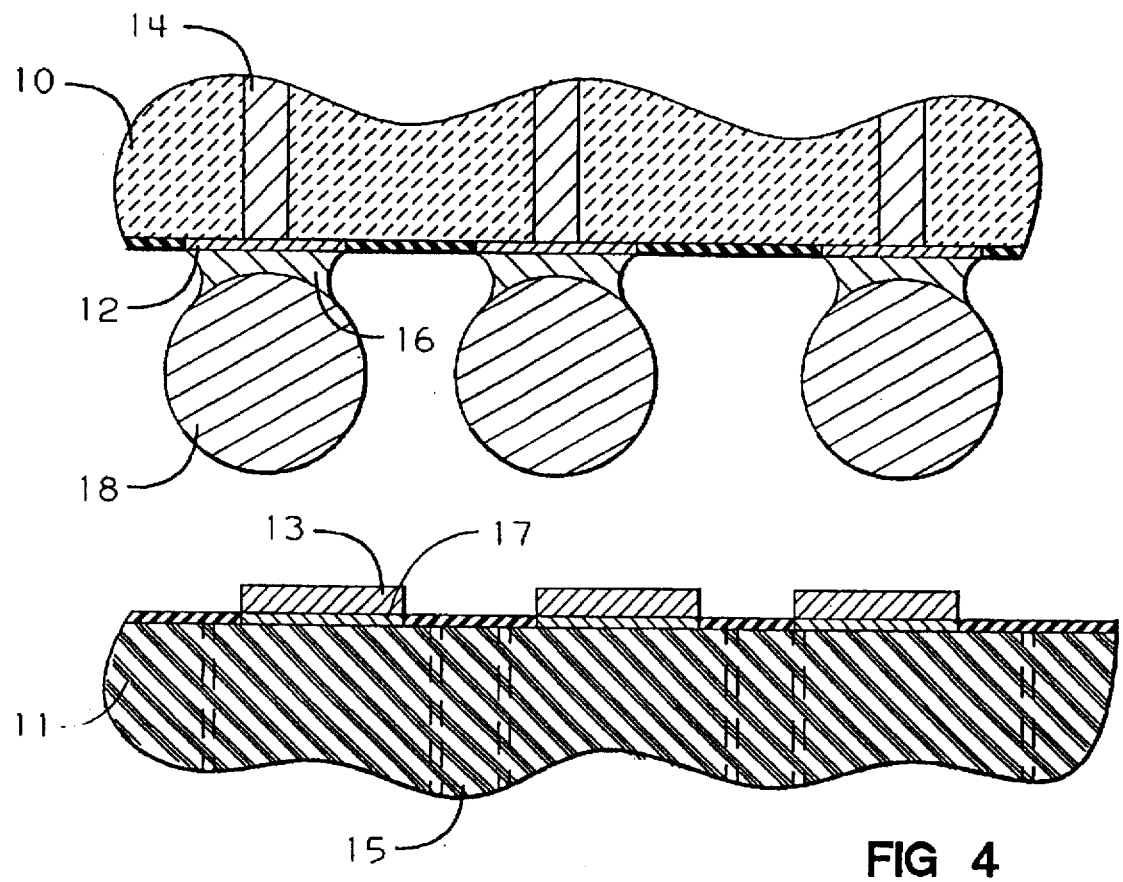
FIG. 4 is a schematic partial cross section through line 4—4 of FIG. 10 of a specific embodiment of this invention showing part of an MLC chip carrier with solder-balls attached to contacts and confronting mirror image contacts of an FR-4 circuit board.

In this invention, as illustrated in FIG. 4, a first substrate 10 is produced with a planer array of contacts 12 and vias 14. In this application substrate refers to any component with a flat surface for interconnection which will be referred to as a major surface in contrast to a narrow edge surface. Although the invention will increase the reliability of connecting flexible circuit boards such as TAB-BGA (tape automated bonding ball grid array) previously known as ATAB components, preferably the first substrate is a rigid component such as an FR-4 or plastic chip carrier, and more preferably a ceramic or MLC (multi-layer ceramic) chip carrier for which these inventions of this application are especially well suited.

As illustrated in FIG. 1, step 101, in the manufacture of ceramic chip carriers, ceramic powders are mixed with binders, solvents and plasticizer and cast to form green sheets of dielectric layers. In step 102, vias are made preferably by punching and in step 103, conductive ink or paste (e.g. Mo frit and solvent) is screened to fill the vias. The wiring pattern may also be screened on the surface at this time and/or exterior wiring layers may be made later using a thin film process. For multi-layer ceramic, in step 104, green sheets are stacked and laminated with heat and pressure into a monolithic structure. Then the green sheet(s) are sintered, in step 105, by firing in an oven with a reducing atmosphere. After sintering the exposed metal is coated for protection (not shown). A thin film process may be used to produce an exterior wiring layer (not shown). For example, conductive metal may be evaporated or sputtered onto the substrate followed by photo-lithographic patterning which may be followed by dialectic coating and additional thin film layering.

The contacts 12 (FIG. 4) may be square or more preferably are approximately round to match the shape of the ball and to allow a closer spacing sufficient to reliably prevent solder bridging. The contacts may be made from any conductive substance, preferably a metal such as Al or Ti and more preferably are made from or covered with Cu, Ni, Au, Pd, or alloys of these. The material may be deposited by screening or a photo-lithographic process may be followed by chemical and/or electric deposition processes.

In step 106 (FIG. 1), the contacts 12 are covered with a volume of a first joining-material 16, such as a conductive thermoplastic or a solder alloy containing Sn, Pb, Bi, In, Ag to form solder contacts or solder bumps of LMT material. In the preferred embodiment the joining-material is Pb/Sn based solder with 20% to 75% Sn and the balance mostly Pb and most preferably is about eutectic 63% Sn and 37% Pb. The LMT solder may be deposited in the molten state by a mass soldering method such as wave soldering or may be screened as solder paste (metal particles in a organic carrier) or may be electrically and/or chemically deposited on the contacts following a photo-lithographic process.

Figure 5:
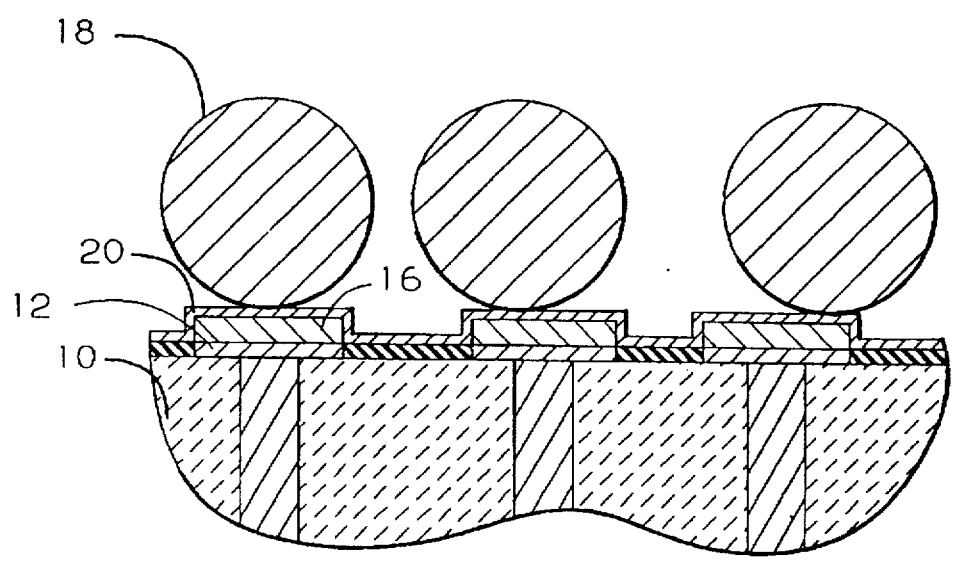
FIG. 5 shows the positioning of solder-balls on the solder contacts prior to attachment to the MLC of FIG. 4.

In step 107 (FIG. 1), as shown in FIG. 5, metal-balls are attached to the solder bumps preferably by applying a layer of sticky flux 20 on which the balls are positioned. The balls may be placed simultaneously by transfer from a vacuum die. The flux may be applied just on the contacts or on the entire area of the substrate interconnections. The balls 18 may be copper preferably coated to prevent oxidation, or more preferably are a HMT solder alloy with a melting temperature substantially higher than that of the joining-material so that the balls may be reflow joined to the contacts in step 108 without melting the balls. Preferably the balls are Sn and 80% to 97% Pb, and most preferably 90%–95% Pb. Preferably the attachment is made reliable by reflow heating to join the ball to the contact so the ball will not fall off during later processing. During fellow of the first joining-material 16, surface tension of the melted joining-material will move the balls 18 from positions shown in FIG. 5 into precise alignment with contacts 12 as shown in FIG. 4. Centering the balls on the pads of the first substrate helps align the balls with the pads 17 of the second substrate 11.

For solder joining-materials, during reflow, metal elements will dissolve or be transported between the LMT solder and the metal-balls. In order to minimize this the reflow attachment of the balls 18 to substrate 10 should be done at the lowest temperature and in the shortest time required to prevent losing the balls during subsequent processing.

In step 109 the substrate is cooled to solidify the joining-material.

As shown in FIG. 4, a second substrate 11 is produced which also has vias 15 and a planer array of contacts 17. The array of contacts 17 is approximately a mirror image of the array of contacts 12. The second substrate may be a flexible circuit board (e.g. thin polyimide and copper layers), or more preferably a rigid board such as ceramic and is most preferably a multi-layer FR-4 printed circuit board. These inventions of this application are especially well suited to applications where there is a significant difference in the thermal coefficients between rigid first and second substrates.

FIG. 2 illustrates the process of manufacturing fiberglass-epoxy circuit boards (e.g. FR-4). In step 120, one or more layers of fiberglass cloth are impregnated with epoxy resin solution to form a dielectric layer. For boards with multiple FR-4 layers, the layers are only partially cured to form stable B-stage layers. In step 121, at least the internal layers are circuitized. FIGS. 9-13 illustrate the surface wiring of this invention and is discussed in more detail later. This step includes forming a rectangular array of preferably round contacts, and forming lands for connection to the vias at the centers of squares defined by four surrounding contacts, and forming connections between the lands and contacts. Usually before drilling to form vias that go through all the layers, the B-stage layers are laminated in step 122 with heat and pressure to fuse the layers and fully cure the boards. Each layer is circuitized by screening or by a photolithographic process in which a metal foil covering is subtractively removed or metal is chemically and/or electrically added selectively to form a wiring layer on the surface of the dielectric layer. In step 123, holes are drilled at the lands, through one or more layers, and in step 124, the holes are internally plated with metal (preferably copper) to form vias for electrical interconnection between the wiring layers on each side of the dielectric layers.

In step 125 (FIG. 2) joining-material 13 (FIG. 4) is deposited on contacts 17 in a similar manner as previously described for step 106 in the process of producing MLC.

Figure 6:
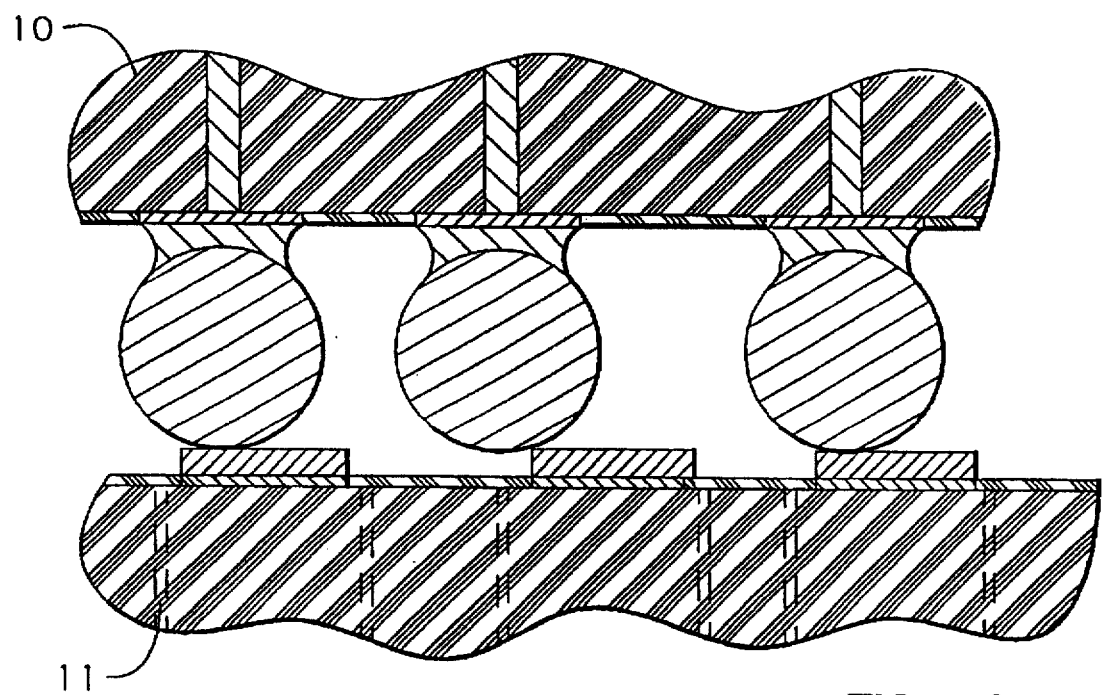
FIG. 6 shows the MLC and FR-4 of FIG. 4 positioned together.

In step 131, substrates 10, 11 are moved into confronting position as shown in FIG. 4, and in step 132, are brought together as shown in FIG. 6. The accuracy of the placement machine is limited so that the substrates are not precisely aligned.

Figure 7:
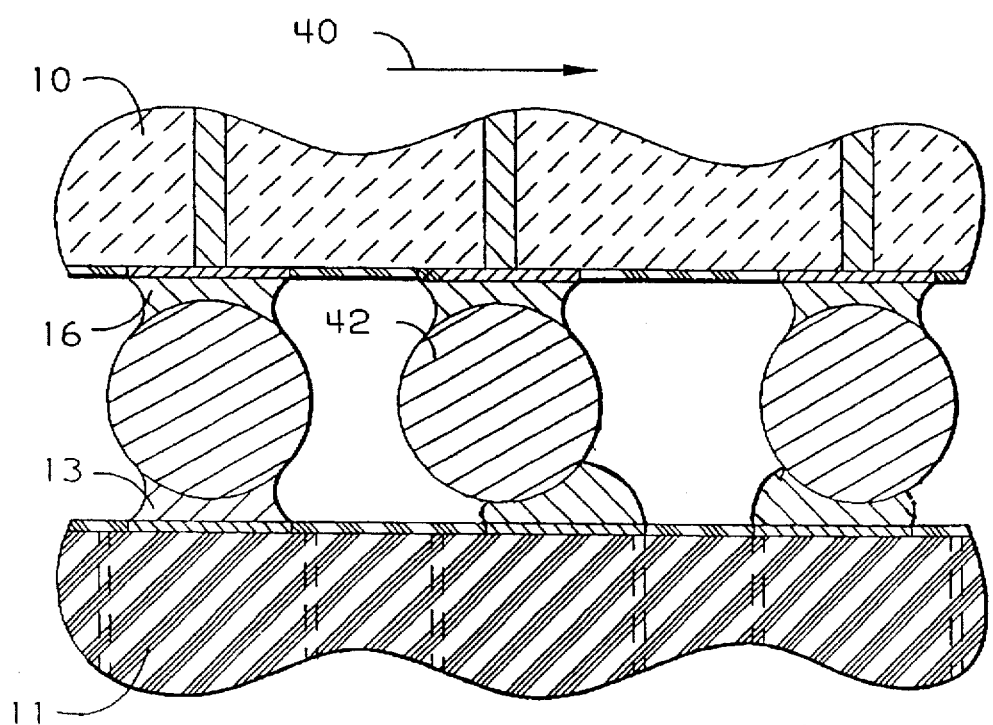
FIG. 7 shows the reflow connections of the MLC to the FR-4 of FIG. 4 in which only the joint between the solder-balls and the FR-4 is melted during reflow.
Figure 8:
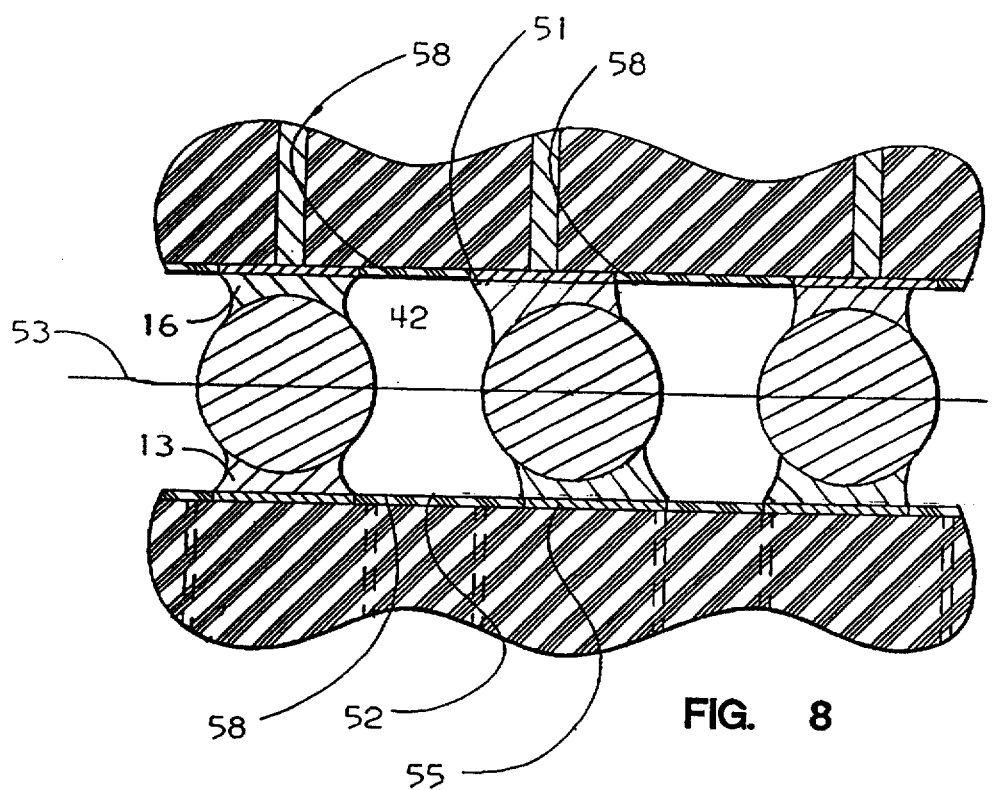
FIG. 8 illustrates the reflow connections of the MLC to the FR-4 of FIG. 4 in which both joints of each connection are simultaneously melted to provide a more symmetric connection.

FIG. 7 shows the results of reflow of only joining-material 13 which moves substrate 10 in the direction of arrow 40 relative to substrate 11 to precisely align the substrates. As illustrated, the connections, such as on either side of ball 42, are not symmetric due to tolerances in the positions of the contacts. Therefore, in step 133, as shown in FIG. 8, preferably both joining-materials 13 and 16 on either side of the solder-balls 18 are simultaneously reflowed to produce more symmetric connections. When both joints 51 and 52 are simultaneously melted the surface tension of the joining-material will move the ball in the plane 53 of the balls toward a position halfway between the centers 54, 55 of the contacts resulting in a more symmetric connection. Such symmetric connections have a greater fatigue life than the non-symmetric connections of FIG. 7.

In step 134, the substrates are cooled to solidify the joining-material of the connections. In step 135, the area between the first and second substrates around the metal-balls is filled with an encapsulant such as epoxy. It is critical to the solder connection configuration invention of applicant that the connections not be encapsulated until after simultaneous reflow of the top and bottom solder joints so that the solder-balls can move into alignment between the contacts. After such alignment encapsulating the area between the substrates, around the balls, further reduces fatigue stress during thermal cycling.

When balls 18 are reflow attached to contacts 12 as shown in FIG. 4, some material will be exchanged between the ball 18 and joining-material 16. For example if the ball is 10/90% Sn/Pb and the joining-material is eutectic 63/37% Sn/Pb then after reflow the joining-material will have a higher Pb content and therefore a higher melting temperature. If joining-material 13 is also eutectic Sn/Pb solder then during reflow for connecting the substrates the joints are going to have to be heated to the higher temperature in order to simultaneously melt both joints. In order to use a minimum temperature for reflow, joining-material 16 may initially have a lead content reduced below eutectic amounts so that during the first reflow it becomes a eutectic mixture and then the simultaneous melting during the second reflow is achieved at minimum temperatures.

Most preferably the balls in FIGS. 4-8 are as large as possible to minimize fatigue stress in the connections only limited by the requirement of reliably preventing bridging between the balls. Stresses in the joints on either side of the balls would be minimized by making the contacts the same size as the balls. However, to reliably prevent bridging between the contacts, the contacts have to be significantly smaller than the balls. As shown in FIG. 8, preferably a solder mask material 58, 59 which repels liquid solder is placed between the contacts to reduce solder bridging so the contacts may be made as close to the size of the balls as possible. For example, connections with 0.9 mm nominal diameter balls and round contacts of 0.7 mm nominal diameter normally spaced at 1.25 mm centers may be made reliably without bridging.

Solder mask materials are well known in the art.

Figure 9:
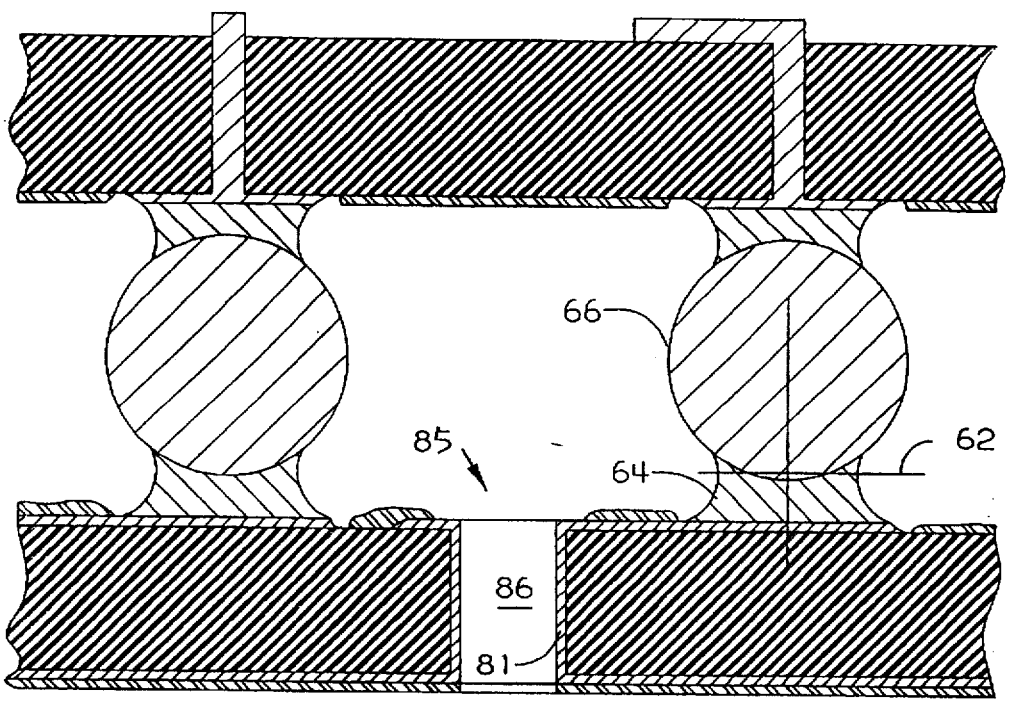
FIG. 9 is a schematic cross section through line 9—9 of FIG. 10, illustrating the "dog bone" connection between plated-through-hole via connection of this invention.

Volumes of LMT joining material should be as large as possible to reduce fatigue, but are limited by the requirements of reliably preventing bridging and of the cost or difficulty in depositing large volumes of solder. Most preferably, as shown in FIG. 9, in plane 62 defined as the cross section of minimum diameter of the joint 64, the minimum joint diameter is at least ⅔ of the diameter of the ball 66. For example if the ball is 0.9 mm in diameter, the joint should be at least 0.6 mm in diameter in plane 62 and more preferably larger.

For ceramic substrates, through-hole vias are usually filled with a HMT metal, and for thin film layers on ceramic, flexible, or FR-4, vias are usually filled or are slightly depressed in relation with contacts that are not on vias. For multi-layer flexible and FR-4 substrates, wiring layers usually contain round lands of metal through which the via holes are formed and which are interconnected between wiring layers by plating the hole. Some of the contacts on FR-4 or flexible substrates may occur on such plated vias. Since the diameter of the solder joint is critical, the volume of solder is critical, but the volume can not easily be controlled at such holes (even if previously filled with LMT solder).

Figure 10:
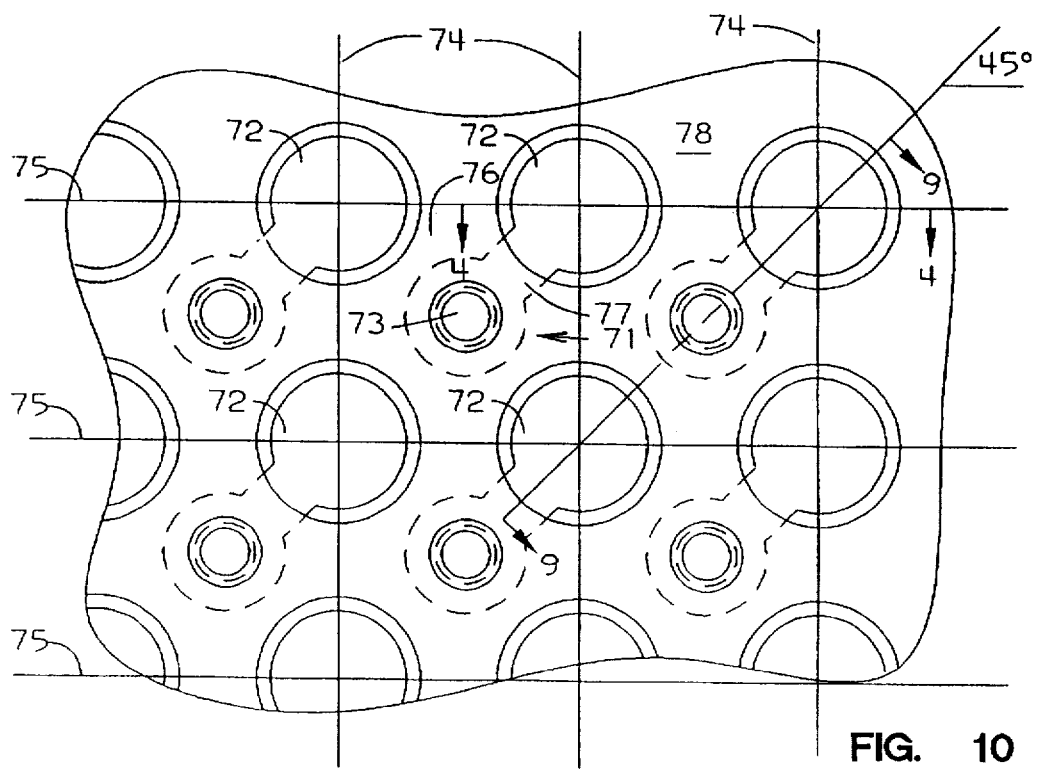
FIG. 10 is a schematic plan view illustrating part of the array of metal contacts and "dog bone" connections between the plated through-holes and contacts.

FIG. 10 schematically shows an arrangement of plated through hole vias 71 each connected to a solder contact 72. This "dog bone" arrangement prevents the solder on contact 72 from flowing into the through-hole 73. In this specific embodiment the centers of the contacts are approximately located at the intersections of multiple, equally spaced, parallel lines 74 and multiple, equally spaced, parallel lines 75 which are perpendicular to lines 74. Vias 71 are located at the centers of squares 76 defined by four contacts 72 around via hole 73. The vias are connected to the contacts through a wire 77 extending under a layer of solder mask 78.

Figure 11:
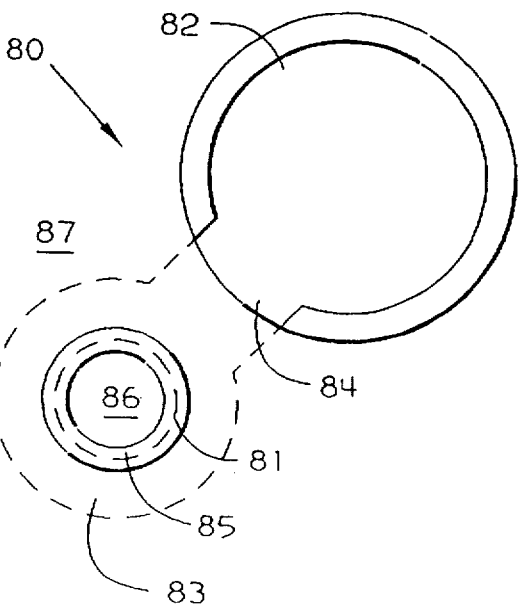
FIG. 11 is larger view of the "dog-bone" arrangement of FIG. 10.

FIG. 11 schematically illustrates a single "dog bone" 80 of this invention prior to depositing joining-material on contact 82. A hole 81 (hidden) is made by mechanical or laser drilling from the surface wiring layer into the substrate, at least to another wiring layer, and metal is deposited to form contact 82, land 83, connecting wire 84 and to plate the interior of hole 85 leaving opening 86. Solder mask 87 covers most of connecting wire 84 and the outer edge of land 83 as indicated by dashed lines to prevent Solder bridging.

Figure 12:
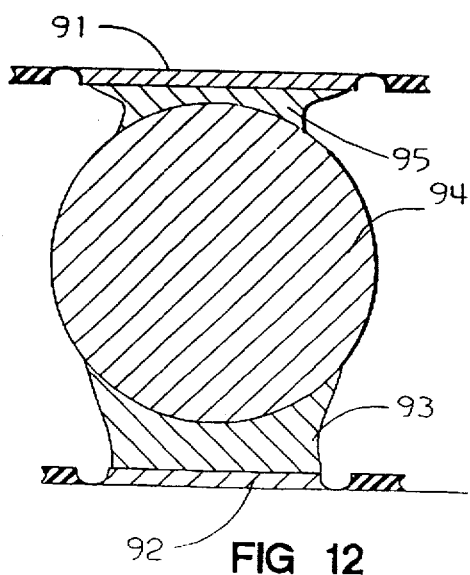
FIG. 12 is another embodiment of this invention with different sized contacts and inversely proportional solder volumes.

FIG. 12 schematically illustrates an alternative embodiment in which metal contact 91 is larger than metal contact 92. In this case in order to reduce fatigue and increase fatigue life of the connection, a higher volume of joining-material 93 is placed between ball 94 and the smaller contact 92, than the volume of solder material 95 between the solder-ball and larger contact 91. Thus the minimum cross sections of the joints on each side of the solder-ball may be made about equal to equalize fatigue at each joint of the connection.

Figure 13:
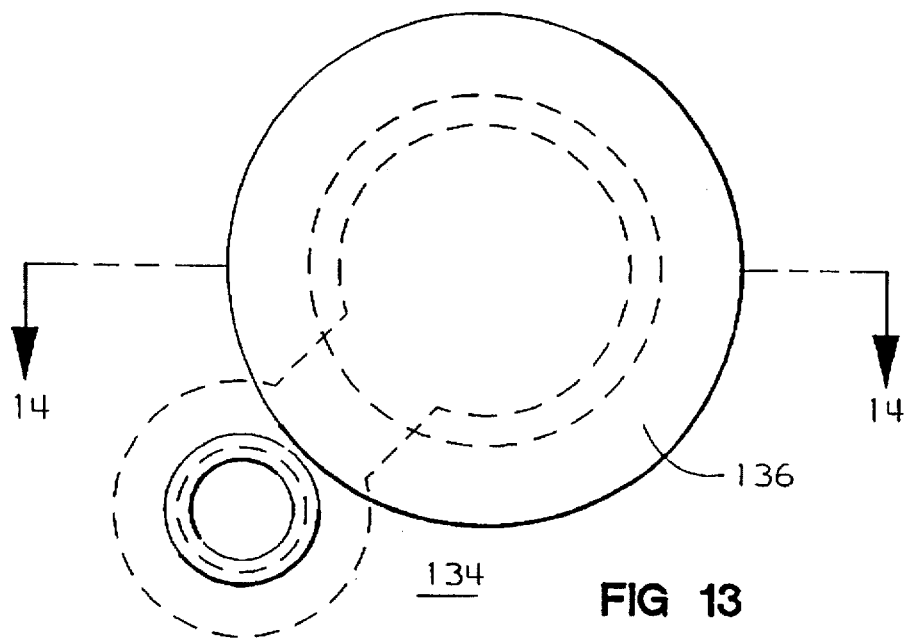
FIG. 13 is a plan view of a flash layer around a contact of this invention for providing sufficient solder volumes for this invention.
Figure 14:
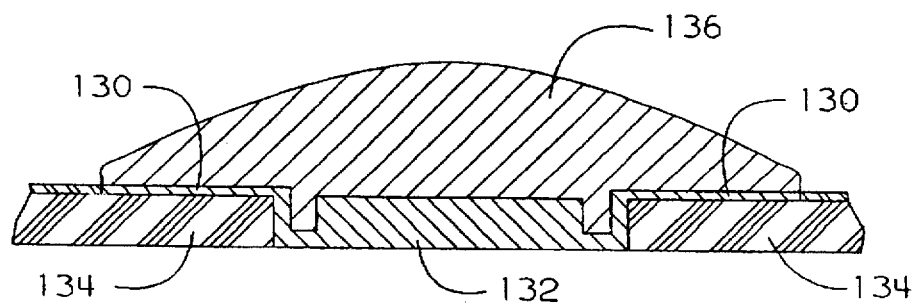
FIG. 14 is a cross section through line 14—14 of FIG. 13 of the contact and flash layer.

FIGS. 13 and 14 illustrate a technique to provide higher levels of solder deposited on a contact than can usually be deposited by wave soldering, electrical, or chemical (electroless) deposition. Flash layer 130 extends out from contact pad 132 over the layer of solder resist 134 the thickness of the flash is exaggerated for illustration. Solder 136 is deposited electrically, chemically, or preferably by melted solder wave. The flash is a conductive substance for electrical deposition, or seed materials such as palladium for electroless plating, a solder wettable material for wave soldering. The thickness of the flash material is selected to completely dissolve the flash during reflow, resulting in all the solder migrating onto contact pad 132. Preferably for wave soldering the flash is copper or tin which is sufficiently thick to survive during deposition, but thin enough to fully dissolve during reflow. The thickness of the solder deposited by molten solder wave generally increases as the size of the flash area increases.

Figure 15:
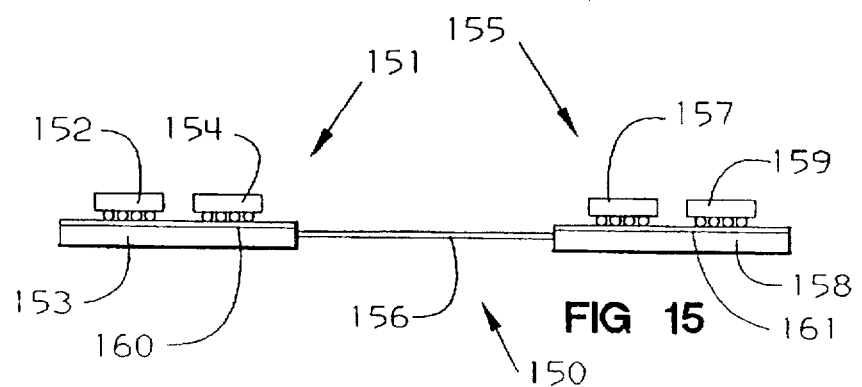
FIG. 15 schematically illustrates the information handling system of this invention.

FIG. 15 shows an information handling system 150 in which computer assembly 151 includes central processor module 152 communicating through one or more wiring layers e.g. a bus 160 in substrate 153 with computer memory module 154 (e.g. RAM). Computer 151 communicates with computer 155 through cable 156. Additional connections (not shown) for cables may be provided for I/O with computer peripherals. Computer 155 also includes central processor module 157 communicating through one or more wiring layers (bus 161) in substrate 158 with computer memory module 159. One or preferably both modules of each computer are connected to the substrate using the preferred solder-ball or solder column connections of the invention.

Figure 16:
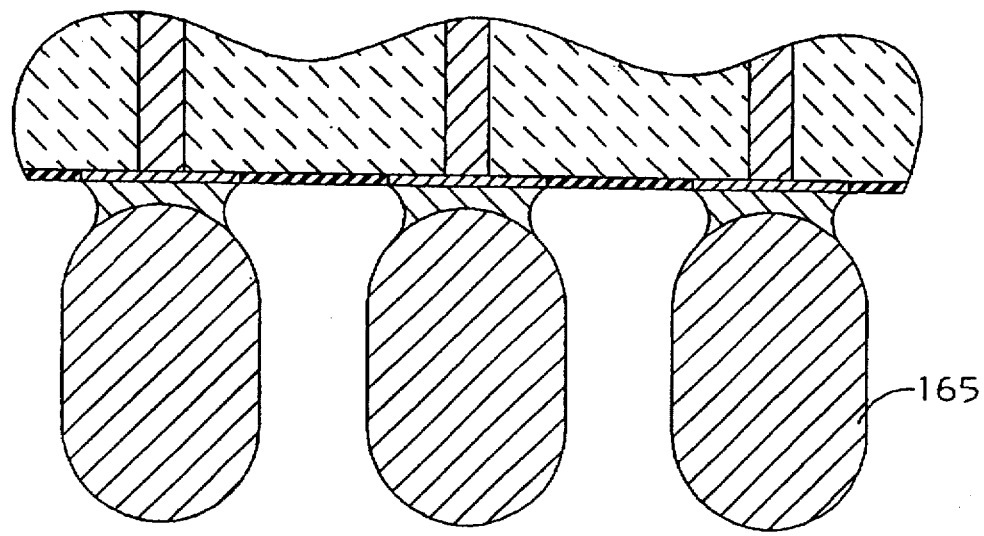
FIG. 16 shows the positioning of solder columns joined to a module.

FIG. 16 illustrates solder columns 160 which are similar to the solder-balls 18 (FIG. 4) and the previous discussion on materials, geometries, and methods of placement, reflow joining to the modules, reflow connection to the substrates are applicable. The columns have approximately hemispherical ends and are preferably from 1 to 20 times longer then their diameters. Fatigue is reduced by making the columns longer, but longer columns result in higher module profiles, reduced lead cooling, and handling problems that militate against the length exceeding that necessary to reliably prevent thermal fatigue failures. In this application the term solder-ball includes hemispherical ended solder columns. In order to join the columns to the module, columns may be reflow heated while attached to the bottom side of the module (i.e. inverted position). This results in the columns being closely centered on the contacts and vertically aligned very accurately.

Figure 17:
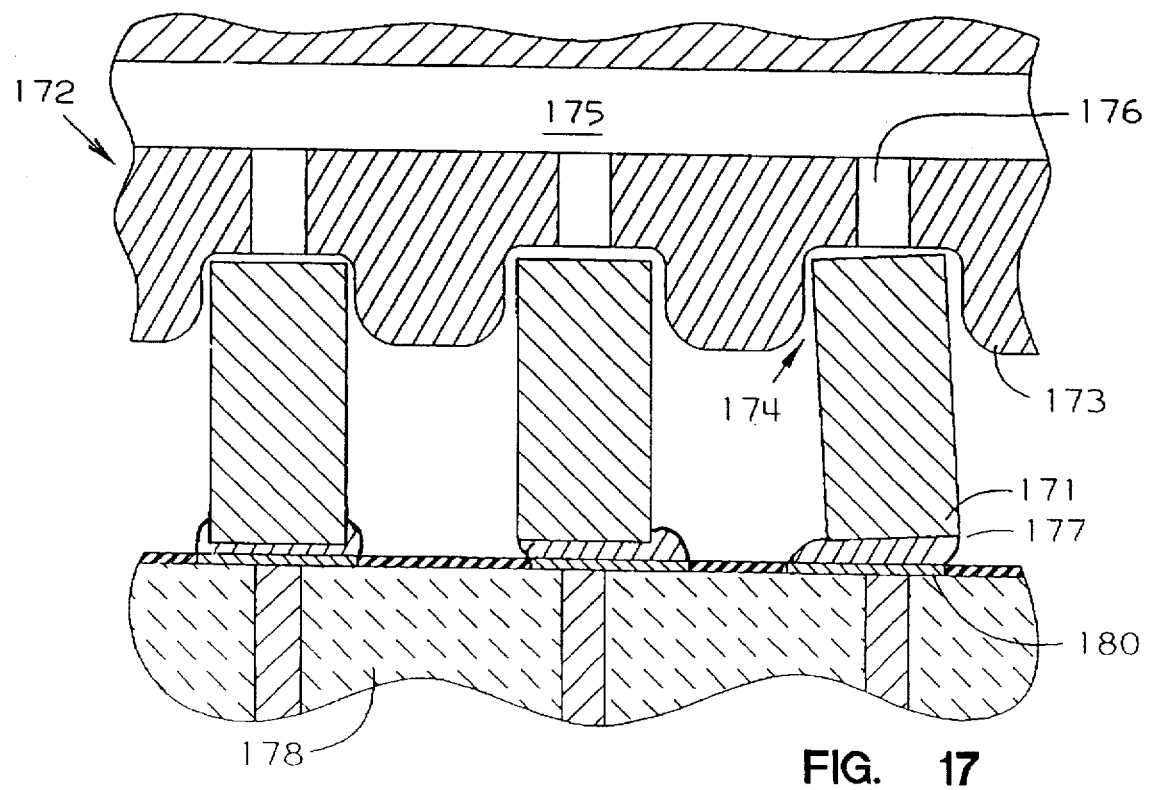
FIG. 17 shows columns having square ends in contact with a vacuum die and in contact with contacts of a substrate.

In FIG. 17, columns 171 have square ends formed for example from cutting extruded solder wire. Vacuum die 172 includes a flat face 173 with recesses which fit the solder-ball or solder column. The recesses 174 communicate with a vacuum reservoir 175 through passages 176 which are significantly smaller than the solder balls or columns to reliably prevent the columns from entering vacuum reservoir 175 and to prevent jamming. The vacuum die is used to position the balls or columns on the contacts of substrate 178 either as shown in FIG. 17 or in an inverted position. Either round or square end columns can be reflow joined in inverted position as in FIG. 16 or by holding the columns vertical during reflow preferably using the vacuum die. The vacuum can be turned off or even reversed during reflow allowing the columns to rest against the solder contacts.

Figure 19:
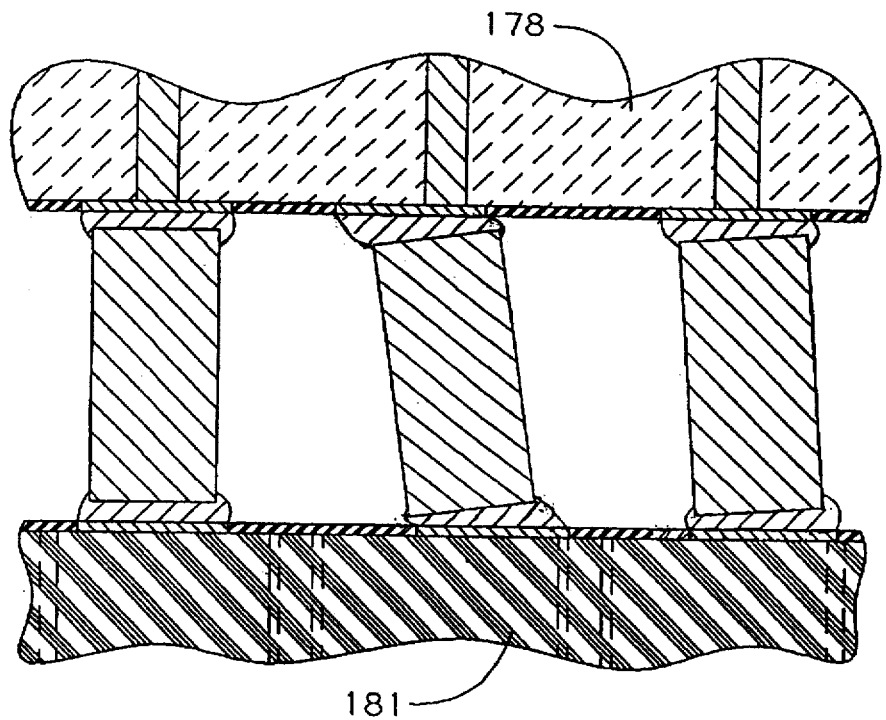
FIG. 19 shows the structure of FIG. 18 after simultaneous reflow of the joints.
Figure 18:
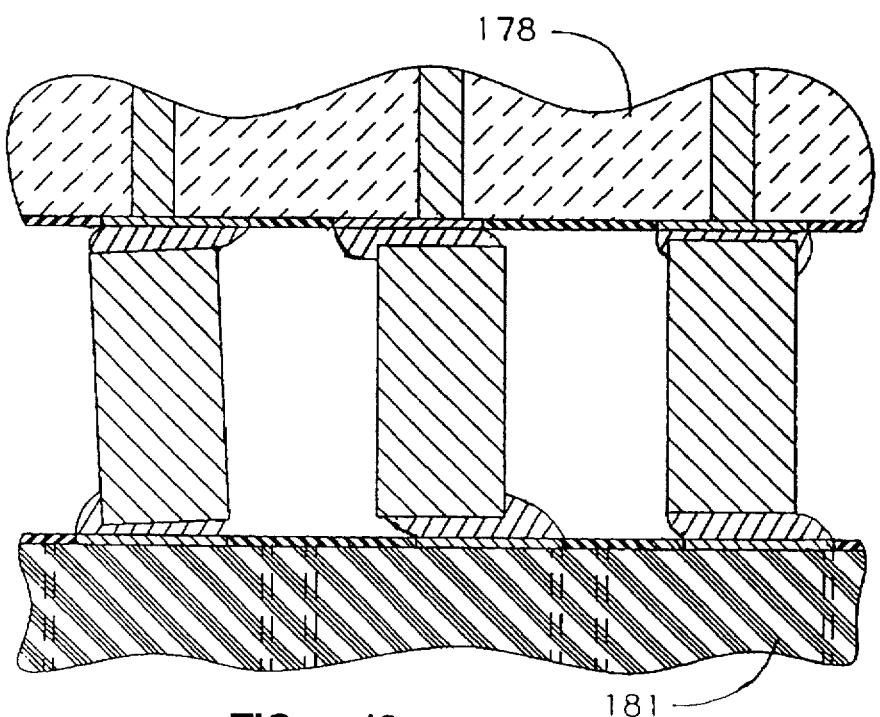
FIG. 18 shows a module substrate connected to another substrate with joints which are not symmetrical.

When the round or square columns are held in position during reflow joining with the contacts 180 of substrate 178, the columns are not as well centered on the contacts, or as vertically aligned or vertically positioned as the joints formed by hanging (FIG. 16). As shown in FIG. 18, when the module substrate is connected to another substrate 181 the joints are not symmetrical. When the simultaneous reflow of the invention is applied as shown in FIG. 19, the joints become much more symmetrical and more reliable.

While this invention has been described in relation to preferred embodiments, it will be understood by those skilled in the art that changes in the details of processes and structures may be made without departing from the spirit and scope of this invention.

What we claim is:

1. A process for producing an interconnect assembly, comprising the steps of:

producing a first substrate with an approximately planer pattern of multiple, metal contacts on a major surface;

depositing a volume of a first joining-material on each of the contacts of the first substrate;

connecting a conductive metal-ball to the first joining-material on each of the contacts on the first substrate to define a plane of metal-balls for maintaining a predetermined distance between the first substrate and a second substrate when connected;

producing a second substrate with a major surface having an approximately planer pattern of multiple, metal contacts which are approximately a mirror image of the pattern of contacts of the first substrate;

depositing a volume of a second joining-material for positioning between the metal-balls and each respective contact of the second substrate;

positioning the substrates together for interconnection with contact patterns parallel, with mirror image pairs of contacts in confronting approximate alignment, and with each volume of the second joining-material approximately in contact with a respective metal-ball and a respective contact of the second substrate;

simultaneously melting the first and second joining-materials while the substrates are positioned together, at a temperature in which the metal-balls remain solid for providing the predetermined separation between substrates, for moving the metal-balls by surface tension of the melted joining-material in directions within the plane of the metal-balls to positions approximately between the pairs of approximately aligned contacts; and cooling the substrates below the melting temperatures of the joining-materials to form electrical interconnections between the pairs of contacts.

2. The process of claim 1, in which the step of connecting a metal-ball to the first volumes of joining-material includes the steps of:
   positioning a metal-ball on each volume of first joining-material;
   heating up the first substrate to connect the metal-balls to the contacts of the first substrate by melting the first joining-material without melting the metal-balls; and
   cooling down the first substrate to form a mechanical joint between the metal-balls and the contacts of the first substrate before the step of positioning the substrates together for interconnection.

3. The process of claim 1, in which the step of connecting a metal-ball to the first volumes of joining-material includes the steps of:
   positioning a metal-ball on each volume of first joining-material;
   heating up the first substrate to connect the metal-balls to the contacts of the first substrate without metal changing the shape of the balls; and
   cooling down the first substrate to form a mechanical joint between the metal-balls and the contacts of the first substrate before the step of positioning the substrates together for interconnection.

4. The process of claim 3, in which there is a metal element which can migrate between the metal-balls and the first joining-material and such migration increase the melting temperature of the first joining-material and during the step of heating up the first substrate the substrate is heated to a minimum temperature and for a minimum time for minimizing migration of a metal element between the metal-balls and first joining-material to minimize the increase of the melting temperature of the first joining-material.

5. The process of claim 4, further comprising the step, selecting a different joining-material for the first and second joining-materials for compensating for migration of the metal element between the metal-balls and first joining-material in order for the first and second joining-materials to be melted simultaneously during the step of heating up the substrates while positioned together.

6. A process for forming an interconnect assembly, comprising the steps of:
   producing a first substrate having on a major surface, a wiring layer including an array of multiple, metal contacts;
   producing a second substrate having on a major surface, a wiring layer including an array of multiple, metal contacts which are arranged approximately mirror image to the contacts of the first substrate and are about the same size as the contacts of the first substrate;
   positioning the substrates with the mirror image arrays of contacts in confrontation to define confronting pairs of contacts;
   positioning conductive metal-balls between the pairs of confronting contacts; and
   connecting joining-material between the metal-balls and each of the respective pair of contacts to electrically and mechanically interconnect the pairs of contacts through the balls.

7. A process for building an interconnect assembly, comprising the steps of:
   producing a first substrate having on a major surface, a wiring layer including an array of multiple, metal contacts;
   producing a second substrate having on a major surface, a wiring layer including an array of multiple, metal contacts which are arranged approximately mirror image to the contacts of the first substrate and are larger in size than the contacts of the first substrate;
   positioning the substrates with the mirror image arrays of contacts in confrontation to define confronting pairs of contacts;
   positioning conductive metal-balls between the pairs of confronting contacts;
   connecting a volume of joining-material between the metal-balls and the respective contact of the first substrate; and
   connecting a smaller volume of joining-material between the metal-balls and the respective contact of the second substrate to interconnect the pairs of contacts electrically and mechanically.

8. A process for producing an interconnect structure, comprising the steps of:
   producing a rigid substrate with an approximately planer matrix of multiple, metal contacts on a major surface;
   depositing a volume of a joining-material on each of the contacts of the matrix of the rigid substrate;
   positioning a conductive metal-ball on the joining-material on each of the contacts on the first substrate to define a plane of metal-balls for maintaining a predetermined distance between the substrate and a second substrate to which the substrate is to be connected;
   melting the volumes of joining-material without melting the metal-balls to prevent changing the shape of the balls; and
   cooling the joining-material to form a solid mechanical joint between the metal-balls and the contacts of the first substrate.

9. A process for fabricating an interconnect structure, comprising the steps of:
   producing a circuit board;
   drilling one or more holes through the board;
   plating the interior of the through-holes with conductive metal;
   forming lands of conductive metal around the holes on a major surface of the board;
   forming a rectangular array or grid of multiple, circular, conductive, metal contacts which are larger than the lands and positioned so that four contacts define a square that surrounds each of the lands; and
   forming a conductor extending in a diagonal direction in relation to the square to one of the contacts between each respective land and one of the surrounding contacts.

10. The process of claim 9, further comprising the step of depositing joining-material on the contacts.

11. The process of claim 10, further comprising the step of connecting to the joining-material, a metal-ball with a melting temperature substantially above the melting temperature of the joining-material.

12. The process of claim 11, further comprising the step of heating, to melt the joining-material to reflow connect the balls onto the contacts and then cooling the joining-material to solidify it.

13. A process for making an interconnect assembly, comprising the steps of:
   producing a circuit board with a multitude of wiring layers;

forming circular copper lands in a wiring layer on a major surface of the board;

making holes in the lands and extending through the board;

selectively depositing copper after drilling to plate the through-holes for connecting the lands to other wiring layers;

forming a rectangular array or grid of round copper contacts larger than the lands, about 0.7 mm in diameter and spaced at about 1.25 mm centers on the major surface and arranged so that four contacts define a square that surrounds each of the lands;

forming a conductor which is narrower than the contacts and narrower than the lands and which extends between each of the lands surrounded by contacts in a diagonal direction in relation to the square of surrounding contacts;

depositing solder resist at least partially covering the conductor and the lands and extending between the contacts to prevent solder bridging;

depositing a joining solder material containing about 37/63% Pb/Sn solder alloy on each of the contacts in the array on the board;

producing multiple green sheets of glass/ceramic particles and an organic binder;

forming via holes through the sheets;

screen printing conductive material into the holes and onto one of the surfaces of the sheets to form a conductive pattern;

stacking the sheets together;

sintering the stack of sheets in an oven to form a multilayer ceramic chip carrier with an array of copper contacts on a major surface which are about 4.7 mm wide, are spaced about 1.25 mm apart, and are arranged approximately mirror image to the array of contacts of the board;

forming an array of round contacts on exterior major surface of the carrier;

depositing solder resist between the contacts to prevent solder bridging;

depositing a joining solder material containing about 37/63% Pb/Sn solder alloy on each of the contacts in the array on the carrier;

positioning a ball of about 90/10% Pb/Sn solder alloy and about 0.9 mm diameter in contact with the joining solder on each respective contact in the array of the carrier to define a plane of solder-balls;

reflowing to melt the joining solder material deposited on the contacts of the carrier without melting the solder-balls in order to solder the balls to the contacts of the carrier and using the minimal temperature and time required to form reliable mechanical joints in order to minimize diffusion of Pb from the balls into the melted solder;

cooling the carrier to solidify the joining solder;

positioning the ceramic carrier parallel to the circuit board with the solder-balls about in contact with the joining solder deposited on the array of contacts on the board so that each solder-ball is between a pair of contacts;

heating the substrates while positioned together to a temperature at which the solder deposited on the contacts of both the carrier and board are simultaneously melted and the solder-balls remain solid for moving the solder-balls by surface tension of the melted solder in directions within the plane of the solder-balls to positions about midway between the centers of the pairs of contacts to produce symmetric connections between the substrates; and cooling the substrates below the melting temperature of the solder materials to solidify the solder material.

14. The process of claim 13, in which:

each of the contacts on the board include a very thin extension over the solder resist;

the solder is deposited on the contacts of the board including the extensions, by wave soldering;

the holes are formed in the board by drilling and formed in the sheets by punching; and the process further comprises the steps of:

reflowing the deposited joining solder on the carrier before positioning the solder-balls;

flattening the joining solder on the carrier before positioning the solder-balls on the carrier;

depositing sticky flux on the flattened joining solder on the carrier before positioning the solder-balls on the carrier;

reflowing the deposited solder on the board before positioning the carrier with the board;

flattening the joining solder on the board before positioning the carrier with the board; and applying flux to flattened joining solder on the board for joining the balls to the board before positioning the carrier with the board.

15. A process for producing an information handling system, comprising:

providing one or more central processing units connected in a network;

providing random access memory communicating through a bus with each central processor unit;

providing input/output means for communication between the bus and computer peripherals;

producing a multi-layer circuit board, having a wiring layer on the surface of the circuit board;

producing a multitude of metal contacts in a planer matrix pattern at positions defined by intersections of a grid of a multitude of approximately parallel about equally spaced lines in each of two about perpendicular directions in a plane of the surface wiring layer; and forming a multitude of conducting vias connecting between one or more other wiring layers of the circuit board and the surface wiring layer at about the centers of squares defined by four of the contacts;

forming a conductor of the surface wiring layer for each respective via, which is narrower than the contacts, and extends in a diagonal direction of the square to connect between the via and one of the four contacts surrounding the via;

providing a chip carrier for one or more chips with a planer pattern of multiple, metal contacts on a major surface which is approximately a mirror image of a planer pattern of contacts on the circuit board to provide confronting pairs of contacts for interconnection between the carrier and the board;

providing a metal-ball for each respective pair of such contacts;

dispensing a volume of a first joining-material for each pair of contacts connected to a respective contact of the chip carrier and a volume of a second joining-material for each pair of contacts connected to a respective contact of the circuit board, with melting temperatures of both the first and second joining-material substantially less than the melting temperature of the metal-balls, with the first and second joining-materials of each pair of contacts soldered to diametrically opposite ends of the respective metal-ball; and connecting the multi-layer circuit board in communication with the central processing units.

16. A process for producing interconnect assemblies comprising the steps of:

producing a first substrate with an approximately planer pattern of multiple, metal contacts on a major surface;

depositing a volume of a first joining-material on each of the contacts of the first substrate;

connecting a conductive metal-column to the first joining-material on each of the contacts on the first substrate for maintaining a predetermined distance between the first substrate and a second substrate when connected;

producing a second substrate with a major surface having an approximately planer pattern of multiple, metal contacts which are approximately a mirror image of the pattern of contacts of the first substrate;

depositing a volume of a second joining-material for positioning between the metal-columns and each respective contact of the second substrate;

positioning the substrates together for interconnection with contact patterns parallel, with mirror image pairs of contacts in confronting approximate alignment, and with each volume of the second joining-material approximately in contact with a respective end of the metal-column and a respective contact of the second substrate;

simultaneously melting the first and second joining-materials while the substrates are positioned together, at a temperature in which the metal-columns remain solid for providing the predetermined separation between substrates, for moving the ends of the metal-columns by surface tension of the melted joining-material to positions approximately at centers of the contacts; and cooling the substrates below the melting temperatures of the joining-materials to form electrical interconnections between the pairs of contacts.

17. The process of claim 16, in which the step of connecting a metal-column to the first volumes of joining-material includes the steps of:

positioning a metal-column on each volume of first joining-material;

heating up the first substrate to connect the metal-columns to the contacts of the first substrate by melting the first joining-material without melting the metal-columns; and cooling down the first substrate to form a mechanical joint between the metal-columns and the contacts of the first substrate before the step of positioning the substrates together for interconnection.

18. The process of claim 17, in which there is a metal element which can migrate between the metal-columns and the first joining-material and increase the melting temperature of the first joining-material and during the step of heating up the first substrate the substrate is heated to a minimum temperature and for a minimum time for minimizing migration of a metal elements between the metal-columns and first joining-material to minimize the increase of the melting temperature of the first joining-material.

19. The process of claim 18, further comprising the step, selecting a different joining-material for the first and second joining-materials for compensating for migration of the metal element between the metal-columns and first joining-material in order for the first and second joining-materials to be melted simultaneously during the step of heating up the substrates while positioned together.

20. A process for producing interconnect structures comprising the steps of:

producing a rigid substrate with an approximately planer matrix of multiple, metal contacts on a major surface;

depositing a volume of a joining-material on each of the contacts of the matrix of the rigid substrate;

positioning a conductive metal-column to the joining-material on each of the contacts on the first substrate for maintaining a predetermined distance between the substrate and a second substrate to which the substrate is to be connected;

melting the volumes of joining-material without melting the metal-columns to prevent changing the shape of the columns; and cooling the joining-material to form a solid mechanical joint between the metal-columns and the contacts of the substrate.

* * * * *

UNITED STATES PATENT AND TRADEMARK OFFICE
CERTIFICATE OF CORRECTION

PATENT NO. : 5,675,889
DATED : 10/14/97
INVENTOR(S) : John Acocella, Donald Ray Banks, Joseph Angelo Benenati, Thomas Caulfield, John Saunders Corbin Jr., Karl Grant Hoebener, David P. Watson It is certified that error appears in the above-indentified patent and that said Letters Patent is hereby corrected as shown below:

Column 2, line 4, --HMP-- is misspelled as "PIMP".

Column 12, line 60, the "." should be removed.

Column 14, line 67, --is-- is misspelled as "Is".

Column 21, line 3, remove "." before "illustrates".

In the Claims:

Column 25, line 35, should read --0.7-- instead of "4.7".

Signed and Sealed this

Seventeenth Day of March, 1998

Attest:

BRUCE LEHMAN

Attesting Officer

Commissioner of Patents and Trademarks